(12) United States Patent
Hutchinson et al.

(10) Patent No.: US 6,597,721 B1
(45) Date of Patent: *Jul. 22, 2003

(54) MICRO-LASER

(75) Inventors: Donald P. Hutchinson, Knoxville, TN (US); Roger K. Richards, Knoxville, TN (US)

(73) Assignee: UT-Battelle, LLC, Oak Ridge, TN (US)

(*) Notice: Subject to any disclaimer, the term of this patent is extended or adjusted under 35 U.S.C. 154(b) by 82 days.

This patent is subject to a terminal disclaimer.

(21) Appl. No.: 09/667,181

(22) Filed: Sep. 21, 2000

(51) Int. Cl.[7] ................................. H01S 3/08
(52) U.S. Cl. ................. 372/98; 372/102; 372/20; 385/129; 385/130
(58) Field of Search .................. 372/102, 98, 20; 385/129, 130, 10, 142; 785/129, 130

(56) References Cited

U.S. PATENT DOCUMENTS

| | | |
|---|---|---|
| 5,216,680 A | 6/1993 | Magnusson et al. |
| 6,028,693 A * | 2/2000 | Fork et al. .................. 359/248 |
| 6,035,089 A | 3/2000 | Grann et al. |

OTHER PUBLICATIONS

Joannopoulos, et al., "Photonic crystals: putting a new twist on light," Nature, 386, 143–149, 1997.
Foresi, et al., "Photonic–bandgap microcavities in optical waveguides," Nature, 390, 143–145, 1997.

* cited by examiner

*Primary Examiner*—Eddie Lee
*Assistant Examiner*—Matthew Landau
(74) *Attorney, Agent, or Firm*—Akerman Senterfitt

(57) ABSTRACT

A micro-laser is disclosed which includes a waveguide, a first and a second subwavelength resonant grating in the waveguide, and at least one photonic band gap resonant structure (PBG) in the waveguide and at least one amplifying medium in the waveguide. PBG features are positioned between the first and second subwavelength resonant gratings and allow introduction of amplifying mediums into the highly resonant guided micro-laser microcavity. The micro-laser may be positioned on a die of a bulk substrate material with one or more electronic and optical devices and may be communicably connected to the same. A method for fabricating a micro-laser is disclosed. A method for tuning the micro-laser is also disclosed. The micro-laser may be used as an optical regenerator, or a light source for data transfer or for optical computing.

80 Claims, 6 Drawing Sheets

MICRO-LASER

STATEMENT REGARDING FEDERALLY SPONSORED RESEARCH OR DEVELOPMENT

The United States Government has rights in this invention pursuant to Contract No. DE-AC05-00OR22725 between the United States Department of Energy and UT-Battelle, LLC.

FIELD OF THE INVENTION

This invention relates generally to optical devices, and more particularly to lasers formed from photonic band gap structures and sub-wavelength grating structures.

BACKGROUND OF THE INVENTION

Light has several advantages over the electron. As used herein, "light" means not only signals in the spectrum of visible light, but also signals in the full spectrum of frequencies typically handled by optical transmission systems. The speed of light is approximately three orders of magnitude higher, compared to the speed of electrons in semiconductors. Thus, photons of light can theoretically carry information approximately 1,000 times faster than electrons in semiconductors. Moreover, photons are not as strongly interacting as electrons with their environment, which allows photonic devices to dissipate less energy, produce less heat and generate less signal noise compared to electronic devices.

In spite of the numerous advantages of photons, all optical circuits have yet to be commercially available on a large scale. Some hybrid opto-electronic circuits have produced significant improvement over the performance of electronic circuits, but the difficulties in designing a multipurpose optical component analogous to the electronic transistor has severely hindered the development of all optical systems.

It is known that as the periodicity of a medium becomes comparable with the wavelength of electromagnetic waves traveling therethrough, the medium begins to significantly inhibit the wave's propagation. A photonic band gap (PBG) structure is one type of optical structure that is currently being investigated for certain electromagnetic (EM) wave applications. PBGs are formed from photonic crystals, which are composite periodic structures made up of two different dielectric materials. Both dielectric materials should be nearly transparent to electromagnetic radiation in the frequency range of interest. However, the composite periodic structure may not be transparent to the frequency range of interest, due to electromagnetic scattering at the interfaces between the two dielectric components. Intervals of prohibited frequencies are called photonic band gaps.

Relying on the subwavelength wave inhibition effect, PBG structures are two or three-dimensional periodic array structures in which the propagation of EM waves may be described by band structure types of dispersion relationships resulting from scattering at the interfaces between the two dielectric components. Waveguide dispersion is the term used to describe the process by which an electromagnetic signal is distorted by virtue of the dependence of its phase and group velocities on the geometric properties of the waveguide. These photonic band gap structures provide electromagnetic analogs to electron-wave behavior in crystals, with electron-wave concepts such as reciprocal space, Brillouin zones, dispersion relations, Bloch wave functions, Van Hove singularities and tunneling having electromagnetic counterparts in a PBG. This has enabled the development of many new and improved types of photonic band gap devices, including devices in which optical modes, spontaneous emission, and zero-point fluctuations are substantially reduced.

PBG structures can also be formed with added local interruptions in an otherwise periodic photonic crystal, thereby generating defect or cavity modes with discrete allowed frequencies within an otherwise forbidden photonic band gap range of frequencies. Generation of an allowed defect state in an otherwise forbidden band gap enables applications such as high-Q resonators or filters.

In the absence of external currents and sources, Maxwell's equations for a photon in a dielectric waveguide may be represented in the following form:

$$\left\{ \nabla \times \frac{1}{\epsilon(r)} \nabla \times \right\} H(r) = \frac{\omega^2}{c^2} H(r)$$

where $H(r)$ is the magnetic field of the photon, $\omega$ is its frequency, c is the speed of light and $\in(r)$ is the macroscopic dielectric function of the waveguide. The solutions $H(r)$ for and $\omega$ are determined completely by the magnitude and symmetry properties of $\in(r)$. If $\in(r)$ is perfectly periodic, as in a photonic crystal comprising a dielectric waveguide having a periodic array of features therein, such as a series of holes etched into the waveguide, the solutions to Maxwell's equation are quantized, characterized by a wavevector k and a band index n. Thus, the periodicity of the waveguide dielectric constant removes degeneracies that would otherwise allow free photon states at the Bragg plane, forming a photonic band gap. The region of all allowed wavevectors is referred to as a Brillouin zone and the collection of all solutions to the above equation is termed a band structure. Thus, in a perfectly periodic photonic crystal, allowed photonic states are quantized, with band gaps having no allowed states between discrete allowed states.

When a periodic array of features, such as holes, is introduced into a waveguide material to form a perfectly periodic photonic crystal, the wavevector k becomes quantized and limited to Π/a, where a is the spatial period of the holes. In addition to putting a limit on wavevector values, the introduction of an array of holes in a waveguide has the effect of folding the dispersion relations $(\omega_n(k))$ of the strip waveguide and splitting the lowest-order mode to form two allowable guided modes. The splitting at the Brillouin zone edge is referred to as a band gap. The size of the band gap is determined by the relative dielectric constants of the waveguide material and the material filling the periodic structures, such as air in the case of holes. The larger the difference in relative dielectric constants, the wider the gap.

If a defect is included into an otherwise periodic PBG structure, an allowed photonic state can be created within the band gap. This state is analogous to a defect or impurity state in a semiconductor which introduces an energy level within the semiconductor's band gap. A defect in the otherwise periodic PBG structure is formed by incorporating a break in the periodicity of the PBG structure. PBG defects can take the form of a spacing variation using constant features, use features having a different size or shape, or use a different material. Introduction of a PBG defect may result in the creation of a resonant wavelength within the band gap.

The resonant wavelength of a PBG structure may be shifted by changing the defect. For example, a PBG structure using a defect in feature spacing can shift the resonant wavelength by altering the length of the defect in feature spacing. Increasing the defect spacing length increases the resonance wavelength to a longer value and also reduces the cavity's Q. The Q of an optical resonant cavity is its figure of merit, defined as 2Π×(average energy stored in the resonator)/(energy dissipated per cycle). The higher the reflectivity of the surfaces of an optical resonator, the higher the Q of the resonator and the less energy loss from the desired mode. An increase in defect length results in a corresponding increase in the effective refractive index felt by the resonant mode due to a reduced density of lower refractive index holes in the higher refractive index waveguide material. The increase in effective refractive index of the waveguide material results in the reduction of the frequency of the resonant mode. This reduction enhances the coupling of the resonant mode to the waveguide mode. This increases the cycle average radiation out of the cavity resulting in a lower Q. A reduction in defect spacing length is expected to produce the inverse result.

Alternatively, the hole spacing may be held constant, but a column of holes having a different size compared to the other PBG holes may be used to introduce an allowed photon state within the PBG band gap. For example, a column of holes may be placed in the PBG hole array having a radius greater or less than the nominal hole radius. As a further alternative, a row of PBG holes filled with a material having a refractive index higher or lower than the material filling the other PBG holes may be used to create an allowed photon state within the PBG band gap. Any of the above techniques may be combined.

Referring to FIG. 1(a), an example PBG structure 100 having a spacing defect is shown. Eight substantially cylindrical holes 101–108 are embedded in silicon waveguide 109. Waveguide 109 has a width 113 of $0.47\mu$ and thickness 114 of $0.2\mu$, which can be supported by silicon dioxide cladding layer 110. Holes 101–108 shown are cylindrical having a radius (r) of $0.1\mu$. The center to center spacing 111 (denoted as "a") between holes 101 and 102 is $0.42\mu$ and equivalent to the distance between holes 102 and 103, 103 and 104, 105 and 106, 106 and 107 and 107 and 108. However, the spacing between holes 104 and 105, 112 (denoted as $a_d$), is not equal to $0.42\mu$. Rather this distance 112 is $0.63\mu$, 50% more than the nominal hole spacing (a).

FIG. 1(b) illustrates the spectral response of the PBG structure 100 etched in a silicon waveguide, as shown in FIG. 1(a). The large contrast of dielectric constant between the silicon waveguide ($\in_{Si}$=12.1) and PBG features filled with air ($\in_{air}$=1) creates a correspondingly wide band gap from between approximately 1300 nm to 1700 nm, or nearly 400 nm as shown in FIG. 1(b). A band gap functions as a stop band. A narrow resonance transmission peak centered at approximately 1540 nm results from placing a spacing defect into the PBG hole array which is otherwise comprised of equally spaced holes. The PBG structure shown in FIG. 1(a) has a calculated cavity quality factor Q of approximately 280 at the resonant wavelength.

Apart from the ability to tune the resonant frequency of the PBG, PBGs allow control of the symmetry of the allowed photonic state. The very specific symmetry associated with each photon mode translates into a specific value of orbital angular momentum for each photon mode which can exist in addition to its intrinsic spin angular momentum. The presence of photon orbital angular momentum states in addition to spin angular momentum states can directly impact the selection rules for electronic transition rates.

The flexibility in tuning the symmetry, frequency and localization properties of photons in PBG cavities makes photonic crystals attractive for the design of novel types of devices, such as lasers. In the case of lasers, photonic crystals can be used advantageously to control the rate of spontaneously emitted radiation.

Spontaneous radiation is energy emitted when a quantum mechanical system drops from a higher energy level ("excited state") to a lower energy level, without a triggering event. This radiation is emitted according to the laws of probability without regard to the simultaneous presence of similar radiation. Upon an atom's or ion's fall to the lower energy state, the energy difference between the higher and lower energy states is released primarily in the form of emitted radiation.

The ability to control spontaneous emission is significant for laser devices. The rate at which atoms decay from high energy states depends on coupling between the atom and the photon, and also on the density of electromagnetic modes available for the emitted photon. PBG crystals can be used to control both the coupling between the atom and the photon, and the density of electromagnetic modes available for the emitted photon independently, simply by changing the properties of the PBG defect states.

For example, the coupling between the atom and the photon involves an integral over all space of the initial and final states of the atom, and of the vector-potential associated with the photon. In the case of a photonic crystal, PBGs can be designed with a vector-potential having a specific orbital symmetry. By doing so, transitions that would otherwise be allowed transitions could be made forbidden, and electronic transitions that were previously forbidden could be made allowable by proper selection of the allowed orbital angular momentum states of the defect-state photon. This latter case would be possible if the wavelength of the electron and that of the photon were designed to be of the same order.

In addition to changing the coupling between the atom and the photon, the rate of spontaneous emission could also be affected by changing the density of allowed states. If a non-zero coupling between the atom and the photon is assumed, the "natural" rate of emission, in free space, is proportional to the free-photon density of states per unit volume, $D_f$, which is given by:

$$D_f \approx \frac{1}{\omega}\frac{1}{\lambda^3}$$

where $\omega$ is the frequency of the transition and $\lambda$ the wavelength of light. If the medium is a photonic crystal with a photonic bandgap comprising a range of forbidden frequencies including $\omega$, there are no allowed modes to couple to and spontaneous emission is accordingly severely inhibited. Conversely, if the photonic crystal is designed to place an allowed resonant state coincident with a desired frequency $\omega$, the emission rate could be enhanced dramatically by the increase in the density of available appropriate lower energy states.

By coupling an optical transition to the microcavity resonance, the spontaneous emission rate can be enhanced by a factor $\eta$ over the spontaneous emission rate with no cavity. The expression for $\eta$ is given as:

$$\eta = \frac{Q}{4\pi V}\left(\frac{c}{n\nu}\right)^3$$

where c is the speed of light and $\nu$ is the optical transition frequency. A large spontaneous emission enhancement could enable the development of devices such as near zero-threshold lasers.

Sub-wavelength structures (SWS) are a second type of optical structure. Grating structures are generally known in the art to provide a method of dispersing incident electromagnetic wave energy. In particular, gratings comprising periodic elements have been used to diffract electromagnetic wave energy, such as light incident on a grating created by periodic slits cut into a given material. When light is incident on the surface of a single diffraction grating, the light may be reflected (or backward diffracted) and/or transmitted (or forward diffracted) at angles that depend upon the periodicity of the grating relative to the wavelength of the incident light and the light's angle of incidence. By the process of diffraction, electromagnetic waves such as light can be separated into its component wavelengths thereby forming a spectrum that can be observed, photographed, or scanned photoelectrically or thermoelectrically. Diffraction gratings can be used to influence the amplitude, phase, direction, polarization, spectral composition, and energy distribution of a beam of light. Gratings are therefore used in common instruments such as spectroscopes, spectrometers, and spectrographs.

Optical wavelength may be defined as the wavelength of an EM wave in a given material and is equal to the wavelength of the wave in a vacuum divided by the material's refractive index. As the period of the grating approaches the optical wavelength of the incident radiation, the diffracted orders begin propagating at increasingly larger angles relative the surface normal of the grating. Eventually, as the grating period is reduced and approaches the optical wavelength of the incident radiation, the angle of diffraction approaches 90 degrees, resulting in propagation of the radiation confined to the plane of the grating. This subwavelength condition effectively couples the fields of the incident radiation within the grating structure, a direction transverse to the surface normal of the grating.

An example of the formation and use of a subwavelength grating structure is described in U.S. Pat. No. 6,035,089, by Grann, et. al ("Grann"), which is assigned to Lockheed Energy Research Corporation, predecessor to the assignee of the current application. The entire contents of U.S. Pat. No. 6,035,089 are hereby incorporated by reference. Grann describes a single subwavelength grating structure (SWS) that uses periodically spaced high refractive index "posts" embedded in a lower refractive index dielectric waveguide material to form an extremely narrowband resonant reflector.

A subwavelength grating structure which functions as a zeroth order diffraction grating can be represented by an effectively uniform homogeneous material having an effective refractive index (neff). Under particular incident wave configurations, such as a substantially normal incident beam, and certain structural constraints, such as the refractive index of the medium surrounding the grating<refractive index of the waveguide<refractive index of the posts, a subwavelength structure may exhibit a resonance anomaly which results in a strong reflected beam over an extremely narrow bandwidth. If the incident radiation is not within the SWS resonant bandwidth, most of the energy of the incident beam will propagate through the grating in the form of a transmitted beam.

This resonance phenomenon occurs when electromagnetic radiation is trapped within the grating material due to total internal reflection. If this trapped radiation is coupled into the resonant mode of the SWS grating, the field will resonate and redirect substantially all of the electromagnetic energy backwards. This resonance effect results in a nearly total reflection of the incident field from the surface, which may be designed to be extremely sensitive to wavelength.

Grann's embedded grating structure results in minimal sideband reflections. Since Grann's resonant structure is buried within a waveguide, both the input and output regions of the grating share the same refractive index, resulting in minimal or no Fresnel reflection losses. Thus, reflection losses are minimized permitting operation as an extremely reflective resonant grating.

Reflective gratings may be combined to perform functions that a single reflective grating is incapable of realizing. For example, a Fabry-Perot interferometer may be constructed by combining two flat highly reflective plates. Fabry-Perot plates are generally set parallel to one another and separated by an optical path length equal to an integral number of half wavelengths of a desired wavelength so that electromagnetic waves of a desired wavelength bounces back and forth between the plates multiple times. Optical path length is the physical separation distance between the mirrors multiplied by the refractive index of the waveguide. For a given plate spacing the requirement for constructive interference being an optical path length equal to an integral number of half wavelengths of the incident radiation of a given wavelength can be fulfilled only at particular incident angles, relative to the surface normal of the plates. Therefore, Fabry-Perot interferometers can be used as spectrometers with high resolution as well as optical resonators. Used as a laser resonator, the Fabry-Perot reinforces only electromagnetic radiation of specific wavelengths traveling perpendicular to the mirror surfaces, and its successive reflections and amplifications form an oscillating mode, creating an optical resonator.

Lasers contain an amplifying medium that functions to increase the intensity of the light that passes through it. The amplifying medium may be a solid, liquid or a gas. In a neodymium YAG (Nd:YAG) laser, the amplifying medium is a solid rod of yttrium aluminum garnate (YAG) containing neodymium ions. Another example of a solid state laser is a laser diode. In a laser diode, also known as a diode laser or semiconductor laser, a semiconductor junction is sandwiched between a p-type semiconductor layer and an n-type layer semiconductor layer. In a dye laser, a fluorescent dye is dissolved in a solvent such as methanol. In a helium-neon gas laser, the amplifying medium is a mixture of helium and neon gases.

The factor by which the intensity of the incident radiation is increased by the laser by action of the amplifying medium is known as the gain. The gain is not constant for a particular type of amplifying medium. Gain depends upon the wavelength of the incoming radiation, the length of the amplifying medium and also upon the extent to which the amplifying medium has been energized or "pumped."

If stimulated emission is to predominate to allow lasing, more atoms must reside in a higher energy state compared to a lower energy state. This condition is referred to as a "population inversion" and accomplished through pumping the amplifying medium. Population inversion is a necessary condition for laser action to occur. In all cases, it is necessary to set up a population inversion so that stimulated emission occurs more often than absorption for lasing to occur.

There are several methods of pumping an amplifying medium. When the amplifying medium is a solid, pumping is usually achieved by irradiating the amplifying medium with intense radiation. This radiation is absorbed by atoms or ions within the amplifying medium and raises them into higher energy states. Often, the pumping radiation comes from xenon-filled flashtubes that are positioned alongside the amplifying medium. Passing a high voltage electric discharge through the flashtubes causes them to emit an intense flash of white light, some of which is absorbed by the amplifying medium. A laser that is pumped in this way will generally produce a pulsed output.

Pumping an amplifying medium by irradiating it with intense radiation is usually referred to optical pumping. In some cases, the source of the pumping radiation is another laser.

An amplifying medium can be pumped by passing an electrical discharge longitudinally or transversely through the amplifying medium. Lasers may be pumped by an electric discharge to produce either a pulsed output or a continuous output. Various other methods of pumping the amplifying medium in a laser are used. For example, laser diodes are pumped by passing an electric current across the p-n junction.

The laser cavity has several important functions. Following pumping, spontaneous emission of radiation results from excited atoms within the amplifying medium initiating emission of low intensity radiation into the laser cavity. This radiation intensity is increased in intensity by multiple passes through the amplifying medium so that it rapidly builds up into an intense beam. The cavity can also help to ensure that the divergence of the beam is small by limiting cavity modes. Only radiation that travels in a direction closely parallel to the axis of the cavity can undergo multiple reflections at the mirrors and make multiple passes through the amplifying medium. More divergent rays will execute a zig-zag path within the cavity and will generally escape from the cavity.

The laser cavity also improves the spectral purity of the laser beam. Usually, the amplifying medium will amplify radiation within a narrow range of wavelengths. However, within this narrow range, only radiation of particular wavelengths can undergo repeated reflection up and down the cavity. The characteristics that a radiation beam within the cavity must possess in order to undergo repeated reflections define what is referred to as a cavity mode. Radiation which may still be amplified by the amplifying medium but which does not belong to one of these special modes of oscillation is rapidly attenuated and will not be measurably present in the output beam. Thus, optical cavity will only sustain repeated reflections for particular well-defined allowed wavelengths of radiation, and only certain modes for the allowed wavelengths.

Gas lasers provide advantages over lasers which use liquid or solid amplifying mediums. One advantage of gas lasers is that their output power density is roughly inversely proportional to the diameter of the waveguide. As the walls of the cavity begin decreasing in separation distance, conductive cooling of the gas with the cavity walls improves due to more frequent collisions with the cavity walls. This effect allows the use of higher gas pressures which improves laser output power. A second advantage of gas lasers is their low noise operation relative to other types of lasers, such as those which use solid amplifying mediums.

SUMMARY OF THE INVENTION

A micro-laser includes an integrated optical resonator formed from a waveguide, a first and a second subwavelength resonant grating in the waveguide and a photonic band gap resonant structure (PBG) in the waveguide. The PBG is positioned between the first and second subwavelength resonant gratings. The micro-laser also includes at least one amplifying medium in the waveguide. In another embodiment of the micro-laser, the PBG has a plurality of holes, and the amplifying medium substantially fills the PBG holes.

The micro-laser waveguide may be selected from the group consisting of Si, Ge, ZnSe, $BaF_2$, CdTe, $LiNbO_3$ and SBN. The micro-laser waveguide may be substantially planar, and further comprise at least one cladding layer positioned adjacent to the planar waveguide. The at least one cladding layer can comprise at least one lower buffer layer positioned under the waveguide and at least one upper buffer layer positioned over the waveguide.

The micro-laser may further comprise a bulk substrate material, wherein the at least one cladding layer is positioned on the bulk substrate material. The bulk substrate material may be selected from the group consisting of silicon, gallium arsenide and indium phosphate. The cladding layers may be selected from the group consisting of glasses, $BaF_2$ and zinc selenide.

The PBG may comprise at least one row of PBG holes having at least one defect therein. The defect can be selected from the group consisting of a spacing defect and a size defect. PBG holes may extend into the cladding layer.

The amplifying medium may comprise at least one gas. The gas can include carbon dioxide. The gas micro-laser may further comprise a reservoir for storing the amplifying medium. The amplifying medium may also comprise a liquid. The liquid may include at least one dye. The amplifying medium may also comprise lasing crystals, including ruby laser, holmium YAG and erbium YAG.

The micro-laser may further comprise a pump for energizing the amplifying medium. The pump can be an optical pump or an electrical pump. The electrical pump may be a RF oscillator, which can be formed on the bulk substrate material.

The pump may be a laser diode. The laser diode can be formed on the bulk substrate material. The pump may also be another laser, such as a UV laser.

The micro-laser may further comprise a pair of electrically conductive discharge electrodes, wherein the electrically conductive discharge electrodes substantially cover the PBG holes and are separated from the waveguide by the buffer layers. The micro-laser may further comprise at least one cladding layer positioned adjacent to the waveguide, a bulk substrate material and an RF oscillator, wherein the RF oscillator is formed on the bulk substrate material and is electrically connected to the electrically conductive discharge electrodes.

Rows of PBG holes may be arranged in linear arrays. Each subwavelength resonant grating structure can comprise a substantially periodic array of SWS features which may be arranged in substantially linear arrays. SWS features and PBG holes may be arranged along arcs having a radius of curvature.

SWS features may be formed from a material having a refractive index higher than that of the material comprising the waveguide and may be selected from the group consisting of Ge, $BaF_2$, $LiNbO_3$, SBN and Si.

The micro-laser may further comprise a bulk substrate material and a heat sink positioned in contact with the bulk substrate material.

The micro-laser may substantially sustain only one propagating mode or sustain substantially at least two propagating modes. The resonator formed by the first and a second subwavelength resonant grating can have a transmission resonance substantially equal to the transmission resonance of the PBG.

A plurality of the micro-lasers may be formed on a bulk substrate material, wherein the bulk substrate material comprises a plurality of die, where the plurality of micro-lasers are positioned on each die. The plurality of lasers may lase at a plurality of wavelengths.

A method for tuning a micro-laser includes the steps of providing a first and second subwavelength resonant grating structure in a waveguide, the first and second subwavelength resonant grating structures in the waveguide having a first resonant transmission wavelength. A photonic band gap resonant structure (PBG) is provided in the waveguide, the PBG positioned between the first and second subwavelength resonant grating structures, the PBG having a second resonant transmission wavelength. At least one amplifying medium may be introduced into the PBG before tuning. At least one of the transmission resonances is tuned to result in the transmission resonances being substantially equal. Preferably, being substantially equal is when a nominal transmission resonance wavelength ($\lambda$) divided by the spread between the PBG transmission resonance wavelength and the first and second subwavelength resonant grating transmission resonance wavelength ($\lambda$) is less than a square root of the product of the PBG Q and the first and second subwavelength resonant grating structure Q. In this context, the nominal transmission resonance wavelength ($\lambda$) may be defined as the arithmetic mean of the PBG resonant wavelength and the resonant wavelength of the resonator formed by the SWS gratings. In the most preferred embodiment, the ratio of the nominal transmission resonance wavelength ($\lambda$) divided by the spread in transmission resonant wavelengths ($\lambda$) is less than ½ the square root of the product of the individual resonators. The method for tuning may be at least one selected from the group of electro-optic, photo-refractive, thermal, magneto-optic and tilting.

A method for producing a micro-laser includes the steps of forming at least one cladding layer, forming a waveguide over the at least one cladding layer, providing a first and second subwavelength resonant grating structure in the waveguide, and providing a photonic band gap resonant structure (PBG) in the waveguide. The PBG is positioned between the first and second subwavelength resonant grating structures, the waveguide having at least one amplifying medium therein. The PBG may comprise a plurality of holes, and PBG holes may be filled with at least one amplifying medium. The method may further comprise the steps of providing a bulk substrate material, wherein the at least one cladding layer is formed over the bulk substrate. The cladding layer may comprise at least one lower buffer layer under PBG holes and at least one upper buffer layer over the PBG holes.

The method may further comprise the steps of forming a first electrically conductive film over the at least one lower buffer layer and forming a second electrically conductive film over the at least one upper buffer layer, the electrically conductive films each forming conductive discharge electrodes. The PBG holes can be substantially covered by each of the electrically conductive discharge electrodes. An RF oscillator made be formed on the bulk substrate material, the RF oscillator electrically connected to the electrically conductive discharge electrodes.

A method for producing at least two micro-lasers on a bulk substrate material, the lasers each operable at a lasing wavelength, comprises the steps of providing the bulk substrate material, forming at least one cladding layer over the bulk substrate material, forming a waveguide over the at least one cladding layer, and providing a first and second subwavelength resonant grating structure in the waveguide. A photonic band gap resonant structure (PBG) is provided in the waveguide, the PBG is positioned between the first and second subwavelength resonant grating structure. The waveguide has at least one amplifying medium therein. In an alternate embodiment, the PBG comprises a plurality of holes substantially filled with the amplifying medium.

The lasers formed may be operated at a plurality of different wavelengths. The micro-laser amplifying medium may be at least one gas, and the gas can be stored in a reservoir. The reservoir can be positioned adjacent to the micro-lasers. The at least one cladding layer may comprise at least one lower buffer layer under the PBG holes and at least one upper buffer layer over the PBG holes. The method may further comprise the steps of forming a first electrically conductive film over the at least one lower buffer layer and forming a second electrically conductive film over the at least one upper buffer layer, the electrically conductive films each forming electrically conductive discharge electrodes. The PBG holes may be substantially covered by each of the electrically conductive discharge electrodes.

The micro-laser of the invention has many uses. A method for processing an electromagnetic signal comprises utilizing the micro-laser for laser radar. The laser may also be used for optical signal regeneration. A method for using the low noise coherent light beam produced by the micro-laser comprises directing an output of the micro-laser into another optical waveguide. The other optical waveguide can be a fiber optic waveguide.

The low noise coherent light beam may be modulated. The modulated low noise output may be used for data transfer, such as in communication systems. The modulated low noise output may also be used for optical computing. A micro-laser with a gas amplifying medium may be used for the above listed uses.

BRIEF DESCRIPTION OF THE DRAWINGS

A fuller understanding of the present invention and the features and benefits thereof will be accomplished upon review of the following detailed description together with the accompanying drawings, in which.

DETAILED DESCRIPTION OF THE PREFERRED EMBODIMENTS

A micro-laser is formed from a resonant micro cavity preferably having two broadband resonant reflective gratings in a waveguide and a photonic bandgap structure (PBG) in the waveguide and positioned between the broadband resonant reflective gratings. At least one amplifying medium is provided in the waveguide. In one embodiment of the invention, the PBG includes a plurality of holes, and the amplifying medium substantially fills the PBG holes to facilitate interaction of the amplifying medium with the resonant micro cavity.

Figure 2A:
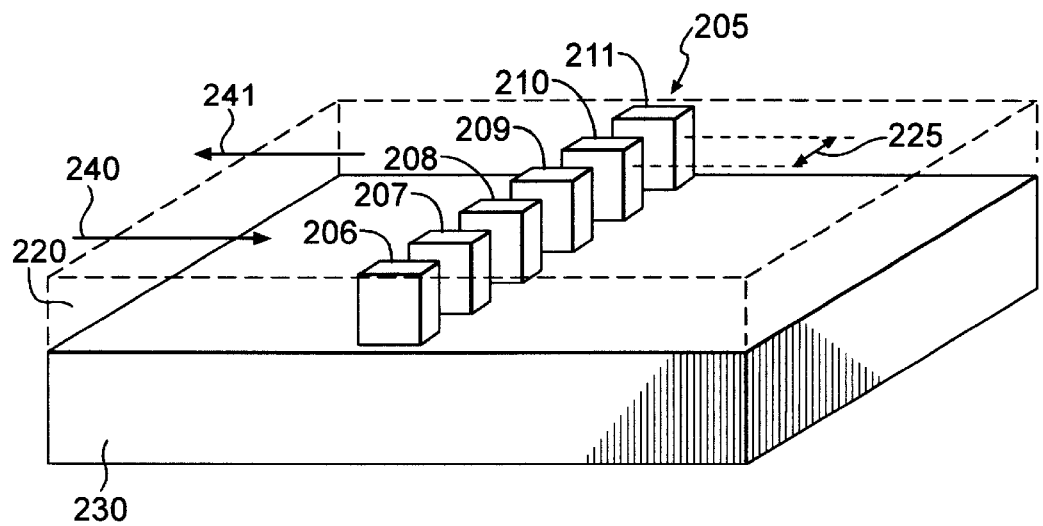
FIG. 2(a) illustrates a perspective view of an SWS grating having six posts.

In the preferred embodiment of the invention, each microlaser requires two broadband resonant gratings in a common waveguide. Referring to FIG. 2(a), a broadband resonant reflecting SWS grating 205 is formed from six high refractive index posts 206–211 in waveguide material 220. Posts 206–211 are periodically spaced having a given post-to-post spacing called a grating period (T) 225. The refractive index of material comprising posts 206–211 should be greater than that of the waveguide material 220. Suitable post materials can include Ge, $BaF_2$, $LiNbO_3$, SBN and Si.

A cladding layer 230 having a refractive index lower than both the waveguide material and post material may be used to physically support the SWS grating 205. An appropriate substrate material may constitute cladding layer 230. If one or more buffer layers are used as cladding layer 230, the substrate material may be chosen based on processing considerations alone if appropriately chosen buffer layers are provided having a refractive index lower than both the waveguide material and post material, and the buffer layer thickness is sufficient to "hide" the substrate material from propagating light therein.

Approximately six to ten (or possibly more) posts 206–211 are believed to be a minimum number for SWS grating 205 to function as a resonant reflector and would correspond to cavity width of three to five resonant wavelengths, since the grating period 225 is nominally equal to one half of a resonant wavelength. Feature shapes also influence SWS 205 function. Shapes such as square, cylindrical and rectangular have demonstrated successful results. Other shapes are also possible. Grating period 225 should preferably be less than the incident wavelength divided by the waveguide index of refraction (i.e., $\lambda_0/(n_{wg})$). The specific grating period depends on the post index of refraction. The larger the post index vs. waveguide index, the smaller the ratio of wavelength to grating periodicity.

Posts 206–211 may be arranged in a line or other arrangements which allow an approximately constant post-to-post spacing. For example, appropriately spaced posts may be placed along an arc having a given radius of curvature.

Again referring to FIG. 2(a), an incident photon beam 240 may be applied to SWS grating 205. A portion of the incident beam 240 is reflected as photon beam 241. If a large percentage of incident beam 240 is reflected, SWS grating 205 is said to act as a mirror. If SWS grating 205 functions as a mirror over a wide range of wavelengths, SWS grating 205 may be said to be a broadband mirror. The reflective bandwidth of a SWS grating 205 may be defined to be a range of wavelength values within the SWS grating's 205 response which are within 3 dB of the SWS mirror's 205 peak reflective response. For example, if SWS grating 205 is fully reflective at a given center wavelength and a line is drawn at 70.71% (3 dB) below the peak reflectivity, a wavelength above and below the center wavelength will be cut. The difference between the wavelengths cut by the 3 dB line may be defined to be equal to the SWS grating's 205 bandwidth. A broadband mirror may be defined to be broadband if its bandwidth is at least approximately 5% and preferably at least 10% of the SWS grating's center wavelength. For a center wavelength of $1.35\mu$, a bandwidth of 10% amounts to a bandwidth of 1350 Å.

Figure 2B:
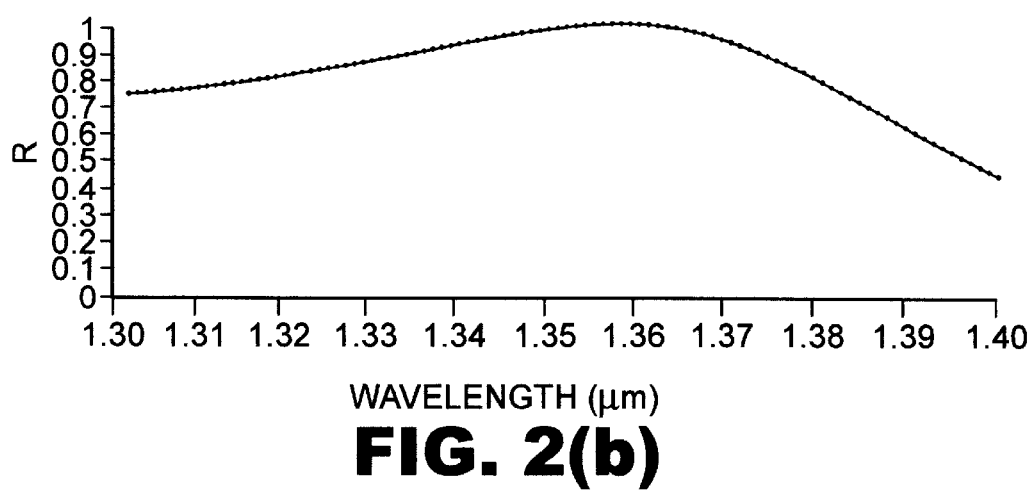
FIG. 2(b) illustrates the calculated spectral response of the SWS grating of FIG. 2(a) using a LiNbO$_3$ waveguide and square silicon posts.

FIG. 2(b) illustrates the spectral response of a broadband mirror over a wavelength range of interest for the SWS grating 205 shown in FIG. 2(a) to an incident photon beam 240, where SWS grating 205 is formed in a $LiNbO_3$ (n=2.2) waveguide with square silicon posts (n=3.5) $0.285\mu$ by $0.285\mu$ having a grating period (T) 225 of $0.57\mu$. The spectral response shown in FIG. 2(b) may be characterized as that of a broadband mirror since its bandwidth extends from approximately $1.3\mu$ to approximately $1.38\mu$, or approximately 6% of the center wavelength of $1.35\mu$. An SWS grating 205 with the above dimensions occupies an area of only approximately 1 square micron.

Figure 2C:
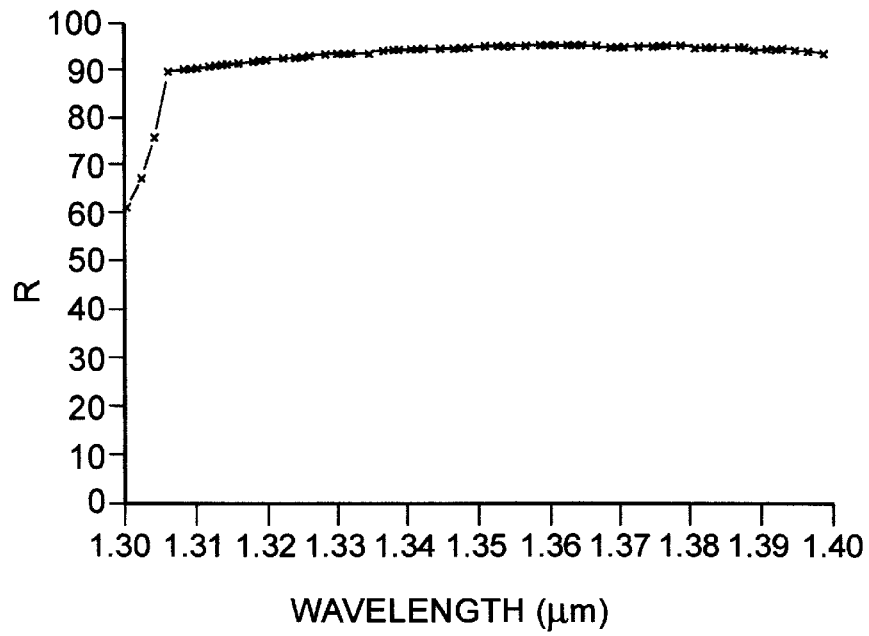
FIG. 2(c) Illustrates the calculated spectral response of the SWS grating of FIG. 3(a) using a BaF$_2$ waveguide and square silicon posts.

FIG. 2(c) illustrates the spectral response of a broadband SWS mirror 205 as in FIG. 2(b), except a $BaF_2$ waveguide (n=1.45) was used. A bandwidth from approximately $1.31\mu$ to over $1.40\mu$ is shown in FIG. 2(c). Both FIGS. 2(b) and 2(c) demonstrate a broadband reflectance over a wavelength range centered around $1.35\mu$.

Although FIGS. 2(b) and 2(c) illustrate an SWS grating 205 demonstrating a broadband resonant reflectance, SWS grating 205 may exhibit no resonances (highly transmissive), an extremely narrow resonance, broadband resonance, or a resonance somewhere between narrow and broad. For example, Grann's grating exhibits a narrowband resonance, having a bandwidth of only few angstroms. The transmission characteristics of SWS grating 205 is determined by factors including the grating period 225, the refractive index difference between the waveguide 220 and post 206–211 materials and the post shape. Determination of appropriate grating parameters for SWS grating 205 to act as a broadband resonant reflector requires solution of Maxwell's equation and repeated iterations through adjustments of the grating period 225, the refractive index difference between waveguide 220 material and post 206–211 material as well as the post shape.

SWS grating 205 may be designed to function as a broadband reflector through iterative solutions by varying SWS parameters. Software simulations are preferably used to solve Maxwell's equations applied to photons interacting with periodic SWS structures, such as SWS grating 205. This problem is usually solved using "rigorous coupled wave equation" simulations. For example, GSOLVER© grating simulation software produced by Grating Software Development Company, located in Allen, Tex., may be used to simulate photon interactions with SWS grating structures, such as SWS grating 205.

The grating variables involved in setting the spectral response of SWS grating 205 include the refractive index of the post 206–211 material, the refractive index of the waveguide 220 material, the grating period 225 and the fill factor, also referred to as the "duty cycle." The fill factor or duty cycle is defined as the fraction of area within the grating region containing posts. Post 206–211, waveguide 220 and cladding material 230 are chosen such that the refractive index of the post 206–211 material exceeds the refractive index of the waveguide 220 material, and the waveguide 220 material exceeds the refractive index of the cladding material 230.

A desired center resonant wavelength $\lambda_0$ is then selected. The initial fill factor may be set at 50%, for example, when the width of individual post is equal to half of the grating period 225. The required grating period 225 to achieve a desired center resonant wavelength $\lambda_0$ may be estimated. The following equation below provides an estimate of the grating period (T) 225 required to achieve a resonant reflectance at a desired center resonant wavelength $\lambda_0$, given the waveguide 220 refractive index ($n_g$) and post 206–211 refractive index ($n_{sws}$).

$$T=3\lambda_0/(n_g * n_{sws})$$

Using a rigorous coupled wave equation software package, such as GSOLVER©, SWS grating structures, such as 205, or optical resonators formed by combining two grating structures such as 205, may be simulated over a range of wavelengths and the resulting center resonance wavelength $\lambda_0$ determined. Once a grating period 225 is found that results in the desired center resonance reflectance wavelength $\lambda_0$, the simulation may proceed to increase the grating's bandwidth.

The reflective resonance bandwidth of SWS grating 205 may be changed by adjusting the post fill factor and the shape of the posts, or both the fill factor and post shape. As a preferred method, the post fill factor is first either increased or decreased, and the results simulated. This iterative method may be continued until the bandwidth is maximized, or at least acceptably wide for a given application. If the bandwidth is not broad enough, the bandwidth may be further changed by changing post shape. For example, in the case of square posts, rectangular posts may be substituted and results re-simulated.

The particular manufacturing process used for fabricating the SWS grating 205 should preferably be inexpensive and reproducible. Conveniently, the SWS grating 205 of the present invention can be fabricated using any standard integrated optics or electronic integrated circuit manufacturing method. Such methods use standard oxidation, deposition, lithography and etching steps. For example, waveguide 220 may be deposited, patterned, and etched simultaneously with the formation of silicon gate electrodes during a CMOS IC process.

In applications where post geometries are deep submicron, posts 206–211 may be formed by E-beam lithography writing the desired pattern into a photoresist layer deposited on the top of the waveguide 220. Once the photoresist is developed, reactive ion etching can be used to create desired structures within the waveguiding region. The next step involves filling in the holes that have been etched away in the waveguiding region with the appropriate post material to create the SWS 205 grating structure. A deposition process such as LPCVD or PECVD may be used for this purpose. Finally, a polishing step, such as chemical mechanical polishing (CMP) to improve surface flatness and to eliminate any surface irregularities caused during the process may be added to reduce the lossiness of the cavity. Thus, the very small size, simple structure and standard processing steps involved in forming SWS gratings 205 permit fabrication on a semiconductor chip and integration with other optical or electronic components on the same chip. The particular manufacturing process used for fabricating the grating is not essential to the present invention.

Figure 3A:
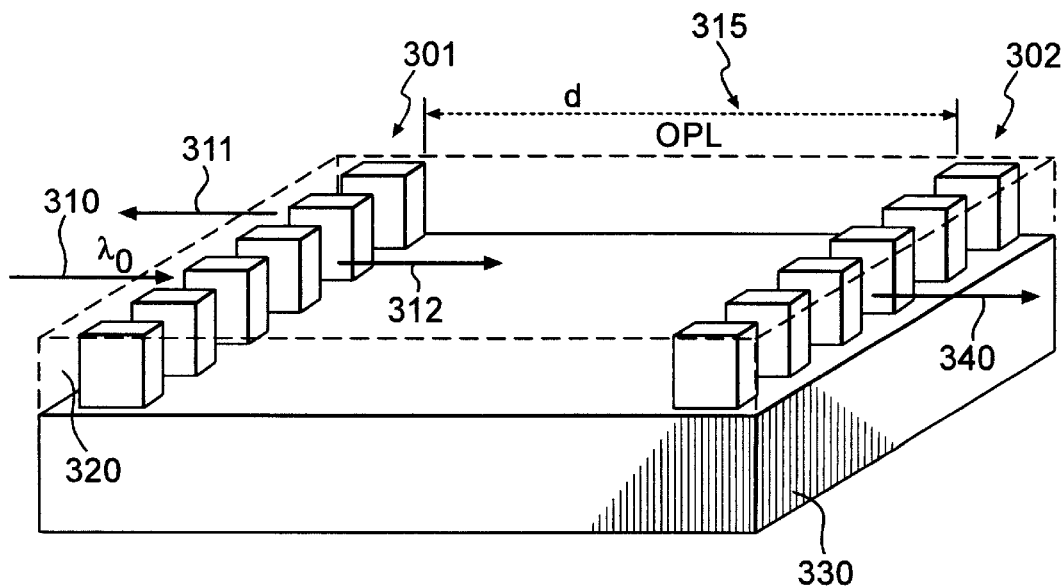
FIG. 3(a) illustrates a perspective view of two adjacent SWS grating structures.

Two broadband reflecting SWS gratings 301 and 302 (collectively hereinafter generally SWS gratings 301/302), may be combined in a waveguide 320 as shown in FIG. 3(a) to form an optical resonator by spacing a first and second SWS gratings 301 and 302 an optical distance 315 equal to approximately an integral number of half wavelengths of the desired resonant wavelength. Optical path length (OPL) or optical distance 315 equals the physical distance between the mirrors multiplied by the refractive index of the waveguide material. SWS gratings 301 and 302 may each be fabricated as described for SWS grating 205. The spectral response of the SWS gratings 301/302 approximates the transmission characteristics of a conventional two mirror Fabry-Perot interferometer.

SWS gratings 301 and 302 within waveguide 320 and may be supported by cladding layer 330 as shown in FIG. 3(a). Although SWS gratings 301/302 may operate individually as broadband reflectors, such as the calculated spectral responses shown in FIGS. 2(b) and 2(c), the combination of SWS gratings 301/302 in a common waveguide 320 can produce near 100% transmission over a very narrow range of wavelengths, while strongly reflecting other wavelengths. Initially, electromagnetic radiation such as light 310 having a wavelength within the bandwidth of SWS grating 301 will be almost entirely reflected 311. The small amount of light 312 that enters the cavity formed between SWS grating 301/302 will be effectively trapped in the cavity, bouncing back and forth many times. At the atomic level, light trapped in the cavity induces electric dipoles on the mirror surface, just like the incident light beam. When the dipoles generated in SWS mirror 301 by the trapped light 312 is 180 degrees out of phase with the dipoles generated by the incident light 310, the resulting dipole amplitude on SWS mirror 301 is reduced. Reduced dipole amplitude allows SWS gratings 301 to become more transmissive, allowing more light 310 into the cavity and further reducing the resultant dipole amplitude and the SWS mirror 301 reflectivity. This process continues quickly until the cavity's optical amplitude and phase are such that the rate of dipoles generated in SWS mirror 301 by the incident light 310 is precisely balanced by the rate of cavity generated dipoles. When this balance occurs, incident light 310 at the resonant wavelength is easily transmitted through the SWS gratings 301 and 302 and the cavity region. The optical wavelength at which this transmission resonance occurs is largely dependent on the optical path length 315 between SWS mirrors 301 and 302.

Figure 3B:
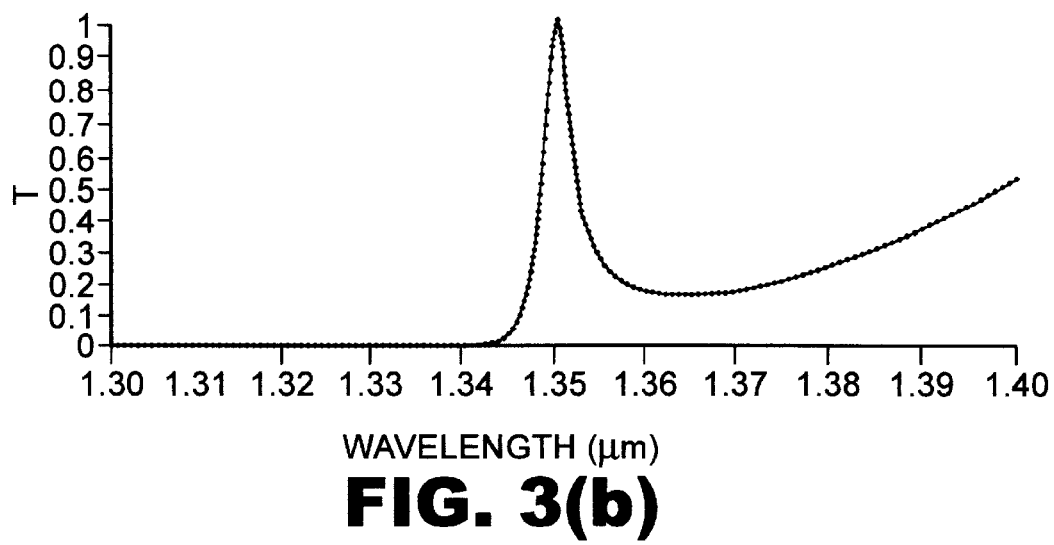
FIG. 3(b) illustrates the calculated spectral response of the SWS mirrors in FIG. 3(a) spaced 0.435$\mu$ formed in a LiNbO$_3$ waveguide having square silicon posts therein.
Figure 3C:
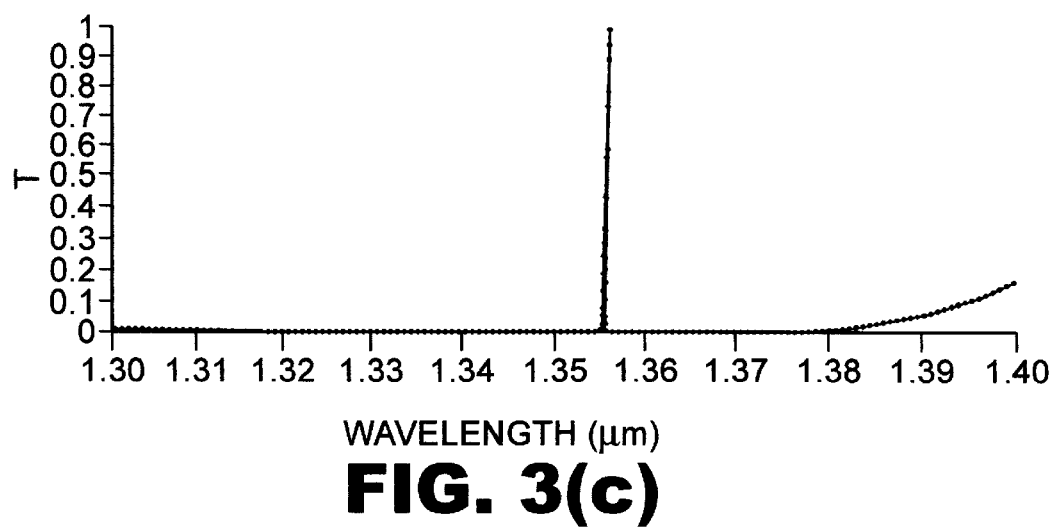
FIG. 3(c) illustrates the spectral response of the SWS mirrors in FIG. 3(a) spaced 1.38$\mu$ apart formed in a LiNbO$_3$ waveguide having square silicon posts therein.

FIG. 3(b) illustrates the spectral response of the SWS gratings 301/302 in FIG. 3(a) having a grating separation of $0.435\mu$ and grating period of $0.57\mu$ formed from a $LiNbO_3$ waveguide with square silicon posts ($0.285\mu$ by $0.285\mu$). The structure described in FIG. 3(b) occupies an area of approximately 3 square microns. A narrow transmission resonance having a 3 dB bandwidth of approximately 30 Å is shown having a center wavelength of approximately $1.35\mu$. The cavity has a Q of nearly 500. FIG. 3(c) illustrates the spectral response of the first and second SWS mirror in FIG. 3(a) having a mirror separation of $1.38\mu$ and grating period of $0.57\mu$ formed from a $LiNbO_3$ waveguide with square silicon posts ($0.285\mu$ by $0.285\mu$). The structure described in FIG. 3(c) occupies an area of approximately 10 square microns. A narrow transmission resonance having a 3 dB bandwidth of only a few angstroms is shown having a center wavelength of approximately $1.355\mu$. The cavity has a Q of nearly 10,000.

As shown by FIGS. 3(b) and 3(c), separating two broadband SWS mirrors 301 and 302 an optical distance 315 equal to an integral number of half wavelengths results in a device that transmits nearly 100% over a very narrow range of frequencies determined primarily by the optical path length 315 between the SWS mirrors 301 and 302. The minimum device size for the resonator depends on the wavelength range to be processed. Shorter wavelengths require smaller area features which reduce the device area. For near IR wavelengths, the device area is on the order of several square microns. Such a size is small enough to be integrated onto a typical semiconductor die (also referred to as a semiconductor chip) and be interfaced with various electronic or optical devices on the same die.

If the resonant cavity is comprised of an elecro-optic waveguide material, such as SBN, CdTe or LiNbO$_3$, and if the waveguide material separating the first and second gratings 301/302 is positioned between two electrodes, the cavity's optical path length can be varied by application of a voltage across the electrodes. Electro-optic materials are materials that have refractive indices that can be altered by application of an electric field. Since the cavity's optical path length (OPL) 315 is a function of the physical grating separation distance (d) multiplied by the waveguide's index of refraction (n), a change in the waveguide's index of refraction shifts the optical path length. A change in the cavity's optical path length shifts the center resonant wavelength an amount $\Delta\lambda$:

$\Delta\lambda=(2d(\Delta n))/m$, where m is possible cavity modes=1,2,3 ... For a single mode cavity, $\Delta\lambda=2d(\Delta n)$.

Application of a voltage across an electro-optic cavity having a Q significantly greater than 1 causes an electro-optic amplification effect because of the electromagnetic wave reflections within the cavity. The Electro-optic effect amplification allows a beam of photons to be modulated with a correspondingly lower applied voltage due to a lengthened residence time in the resonant cavity. For example, an electro-optic cavity having a Q of 500 allows a voltage equal to 1/500 of the voltage otherwise required to modulate an electro-optic cavity having a Q equal to 1. Thus, a low voltage optical modulator may be realized which allows higher switching speeds and compatibility with state of the art integrated circuits which use very low power supply voltages, such as 1 volt, or less.

The applied voltage can be a high speed alternating voltage signal to permit high speed modulation or switching. The ability to switch with low supply voltages due to the electro-optic amplification effect provides increased switching speeds. The resonator formed by SWS gratings 301/302 in an electro-optic waveguide 320 may also be used to implement logical functions. For example, an incident light 310 having a wavelength equal to the resonant wavelength may be applied to SWS gratings 301/302 positioned in an electro-optic waveguide. Prior to application of a voltage across the waveguide, incident light 310 is efficiently transmitted through SWS grating 301/302 and the cavity region between leaving the cavity as transmitted light 340. An appropriate light detector can be used to measure the intensity of transmitted, light 340, an intensity above a certain level treated as a logical state, such as "1". Application of an appropriate voltage across the electro-optic waveguide 320, changes the waveguide's refractive index resulting in a new optical path length 315. Thus, incident light 310 will not be transmitted and the lack of sufficient intensity of transmitted light may be treated as a logical "0," for example. Consequently, SWS gratings 301/302 together with a source of refractive index modulation of the waveguide may be used to implement logical and memory devices.

The manufacturing process used for fabricating the first and second SWS grating 301/302 may be the same as the standard optics or electronic integrated circuit methods described earlier. First and second SWS mirrors 301 and 302 may be simultaneously formed on semiconductor chips during standard IC processing. As in the case of the formation of a single SWS grating 205, the particular manufacturing process used for fabricating the grating is not essential to the present invention.

Figure 4:
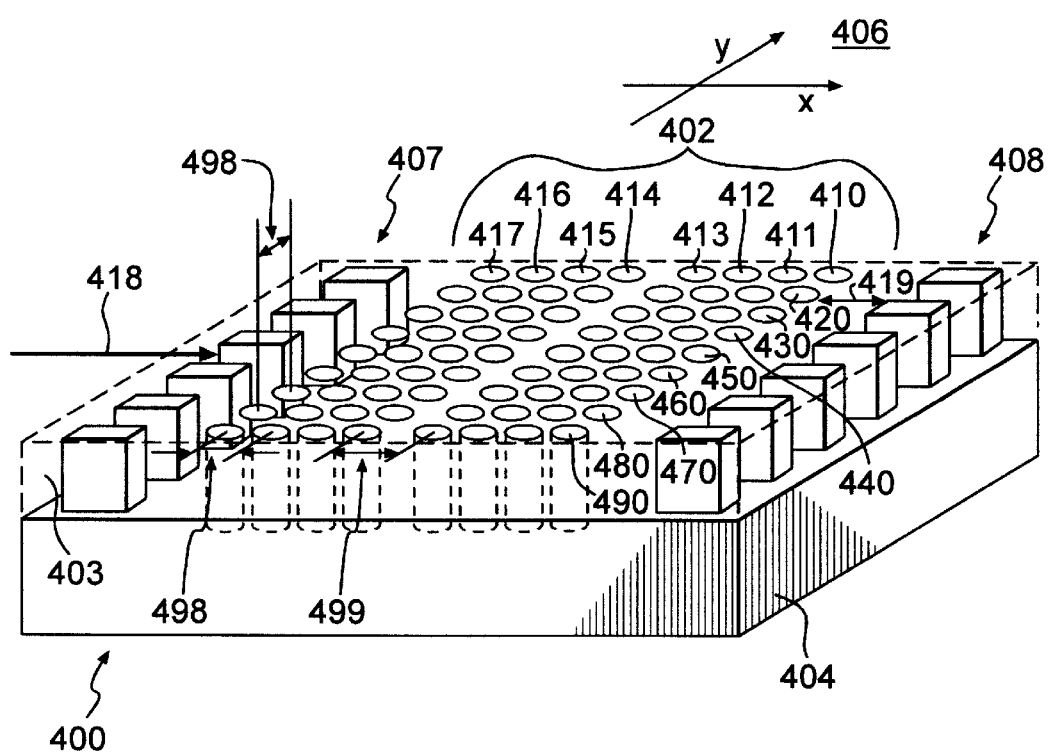
FIG. 4 illustrates a perspective view of a transverse longitudinal integrated resonator (TLIR).

Referring to FIG. 4, a first and second subwavelength grating structure 407 and 408 (hereinafter collectively SWS gratings 407/408) are combined with a photonic band-gap (PBG) structure 402 positioned between gratings 407 and 408 to form a transverse-longitudinal integrated resonator (TLIR) 400. TLIR 400 having PBG features, such as holes 410–417, 420–427, 430–437, 440–447, 450–457, 460–467, 470–477, 480–487 and 490–497 (hereinafter collectively PBG features 410 . . . 497) substantially filled with a laser amplifying medium permits formation of a micro-laser.

A TLIR 400 optical cavity may be fabricated having a high Q and exhibiting a narrowband transmission resonance. An advantage of including PBG 402 within the TLIR 400 cavity is access to the TLIR 400 cavity and concentration of optical energy residing in the TLIR 400 cavity in the PBG features comprising holes 410 . . . 497. Although the PBG features shown in FIG. 4 are holes, in some laser applications PBG features 410 . . . 497 can be substantially filled with a variety of amplifying materials. Amplifying materials may be in the solid, liquid or gas phase. For example, crystals such as holmium YAG, erbium YAG and ruby (aluminum oxide in which a small fraction of aluminum ions have been replaced with chromium ions) may be formed in PBG features 410 . . . 497. Liquids, such as dyes dissolved in solvents such as alcohol, may be placed in PBG features 410 . . . 497. Finally, gases, such as $CO_2$, Ar, He/Ne, CO, $N_2$ as well as many others may be placed in PBG features 410 . . . 497.

In forming TLIR 400 to function as a micro-laser, it is preferable that each SWS grating 407/408 exhibit a broadband resonance, equivalent to that of a broadband highly reflective mirror over the wavelength range of interest. Both SWS 407/408 and PBG 402 are within a common dielectric waveguide material. Waveguide materials should preferably be substantially planar to minimize lossiness and thickness chosen to preferably sustain only one propagating mode at the resonant wavelength therein for most laser applications.

In laser applications, such as optical communications systems where single mode ($TEM_{00}$) operation is desirable, it is preferred that the waveguide thickness be approximately 0.5 to 1.0 optical wavelengths. The lowest order propagating mode, $TEM_{00}$, corresponds to a single photon path and a nearly gaussian energy density pattern centered near the TLIR cavity's 400 core, the ray having a wavelength equal to the cavity's resonant wavelength. A waveguide thickness below approximately 0.5 wavelengths begins to substantially attenuate a given light wave. For multi-mode such as laser applications requiring maximum power, it is preferred the waveguide thickness exceed one optical wavelength to support higher order propagating modes in addition to $TEM_{00}$.

For example, assuming a $CO_2$ micro-laser is formed from TLIR 400 having a Ge waveguide (n=4) and transmission resonance wavelength of approximately $10.6\mu/4=2.65\mu$, a preferred waveguide thickness range to produce a single mode laser output is between approximately $1.32\mu$ and $2.65\mu$.

Cladding layer 404 may be added adjacent to TLIR 400 to help support TLIR 400. If a bulk substrate material constitutes cladding layer 404, the bulk substrate material should have a lower index of refraction than waveguide 403 material so that the bulk substrate material functions as a cladding material relative to the waveguide 403. Cladding layer 404 material should also be compatible with processing required to form the TLIR 400. Examples of suitable materials that may be positioned near waveguide 403 include most glasses (such as $SiO_2$, n=1.45 to 1.5) and $BaF_2$ (n=1.39).

However, if cladding layer 404 comprises a buffer layer having sufficient thickness to hide a given layer such as a bulk substrate material from waveguide 403, the bulk substrate material can generally be chosen based on process compatibility without regard to its refractive index. For example, in this case, a bulk substrate material may be silicon, GaSb, GaAs or other commonly used bulk substrate materials.

Suitable waveguide materials are preferably materials having poor electrical conductivity and relatively high refractive indexes. In addition, the waveguide 403 material should have a uniform index of refraction and a very low absorption coefficient. Consequently, polycrystalline, amorphous as well as single crystal materials having the above characteristics generally make suitable waveguide 403 materials for most TLIR 400 applications, such as microlasers.

The refractive index of the waveguide 403 material should be less than the refractive index of the SWS posts 407/408, as described later, but greater than the refractive index of the adjacent cladding layer or layers. Generally suitable waveguide 403 materials include Ge, $BaF_2$, ZnSe, CdTe, $LINBO_3$, SBN and Si. As noted earlier, the thickness of the waveguide should preferably be from 0.5 to 1 desired resonant wavelength if single mode operation is desired.

Even in TLIR 400 applications where electro-optic modulation is normally not required, such as a typical laser, it may still be desirable to retain the ability to change the TLIR 400 cavity's optical path length. For the TLIR 400 cavity to properly operate as a narrowband transmitter, PBG 402 should be substantially transmissive at a wavelength preferably substantially equal to the resonant wavelength of the resonator formed by SWS gratings 407/408. If the respective transmissive wavelengths following fabrication do not coincide sufficiently for proper TLIR 400 operation, one or more methods for tuning TLIR 400 may be used. For example, TLIR 400 may be tuned by modification of the optical path length of TLIR 400. Optical path length modification primarily shifts the resonant wavelength of the resonator formed by SWS gratings 407/408.

The refractive index of any material introduced into the micro cavity, such as a laser amplifying medium, may shift the resonator's optical path length by changing the waveguide effective refractive index. The PBG 402 resonant frequency may be affected by the index of refraction of the amplifying material filling the PBG features. In the case of a gas laser, the index of refraction of most gases (generally being close to 1) will not measurably affect the TLIR 400 resonant transmission frequency, other than some possible attenuation via absorption by the amplifying media. However, high pressure gases as well as liquids or solids introduced into the PBG features 410 . . . 497 are expected to measurably shift the TLIR resonant frequency. Accordingly, such effects should be accounted for in the design, such as modified mirror spacing and/or provisions made for post fabrication adjustment, to permit tuning the resonator's resonant frequency.

The waveguide 403 may be characterized as having an effective refractive index based on the refractive index of the waveguide material combined with the refractive index of the material filling the PBG features 410 . . . 497. The optical path length in the cavity is equal to the effective waveguide refractive index multiplied by the physical spacing distance between the SWS gratings 407/408.

PBG 402 is formed in waveguide 403 from a plurality of periodic low refractive index features, such as holes. Such features may be formed by a suitable lithographic and etch process. PBG features 410 . . . 497 and the nominal hole spacing 498 should be less than the desired resonant wavelength.

Practical PBG 402 structures generally contain multiple columns of equivalent PBG features, such as the column defined by holes 410, 420, 430, 440, 450, 460, 470, 480 and 490 to substantially fill the waveguide width created by SWS gratings 407 and 408.

PBG features 410 . . . 497 may be arranged in nonlinear arrays provided constant feature spacing is maintained. For example, PBG features 410 . . . 497 may be arranged along arcs having a given radius of curvature.

Substantially filling the entire TLIR cavity 400 width with periodically placed PBG features 410 . . . 497 maintains the same effective refractive index along the entire waveguide 403 width. This minimizes undesirable effects such as Fresnel reflections.

Figure 1A:
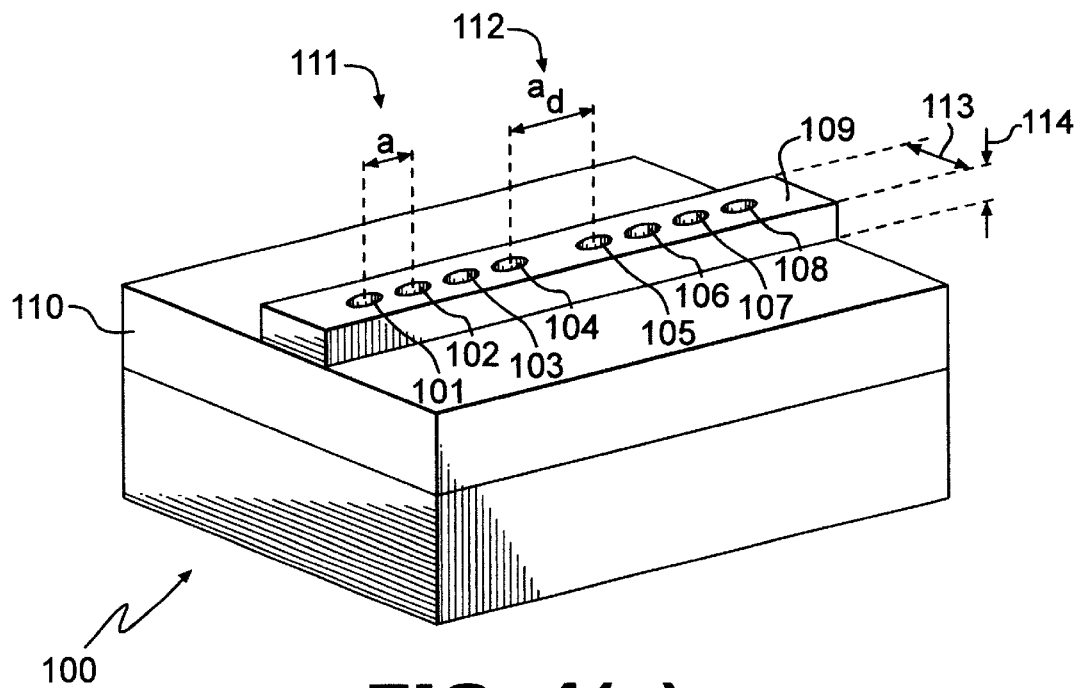
FIG. 1(a) illustrates a perspective view of a PBG structure with an introduced spacing defect.

Six to ten PBG features 410 . . . 497 per arc or row are believed to be a minimum number to achieve a spectral response comparable to that of FIG. 1(*b*) and would correspond to a cavity length of three to five resonant wavelengths, since the period between PBG features 498 is nominally equal to ½ of a resonant wavelength. PBG hole periodicity should preferably be less than the incident wavelength divided by the waveguide index of refraction (i.e., $\lambda_0/(n_{wg})$).

PBG feature shape may also be altered. Shapes such as cylindrical and rectangular PBG features 410 . . . 497 have been modeled with successful results. Other shapes are also possible.

An allowed photonic state may be positioned within the PBG band gap by placing a defect into the PBG structure 402. A defect may be added to the PBG 402 by the introduction of a defect in the spacing of an otherwise constant feature spacing (spacing defect). Alternatively, in the case of PBG features comprising holes, a column of holes having a different size compared to the other PBG features 410 . . . 497 may be placed in the PBG hole array (size defect), such as a column of holes having a volume greater or less than the nominal hole volume. In the case of cylindrical holes, changing the hole volume would normally be accomplished by changing the hole radius relative to other PBG features.

As a further alternative, a row of PBG features filled with a material having a refractive index different (higher or lower) relative to the other PBG features (refractive index defect) may be used to create an allowed photon state within the PBG 402 created band gap. The above techniques may also be combined. For example, a column of PBG features 410 . . . 497 having a radius greater than the nominal radius (size defect) may be filled with a material having a refractive index to greater than that of the other PBG features (refractive index defect).

For example, for a desired resonant wavelength of approximately 1.5μ, PBG features 410 . . . 497 may be periodically spaced 0.42μ, the defect length set to 0.62μ, and hole radius of 0.1μ. Introduction of a defect in the spacing of an otherwise periodic array of low refractive index features (spacing defect), such as holes 410 . . . 497, creates an allowed photonic state within the PBG 402 and results in a longitudinal cavity resonance, providing nearly a 100% transmission at the resonant wavelength within the PBG 402 band gap.

For example, defect 499 having a length of 1.5 times the otherwise periodic hole spacing 498, or 0.63μ, may be used to create a resonant wavelength of approximately 1.54μ within the gap created by PBG features 410 . . . 497. Transmission at wavelengths above and below the resonant wavelength within the band gap wavelength range is highly attenuated, such as the spectral response shown in FIG. 1(*b*).

Increasing the defect length 499 shifts the resonant wavelength to higher value and also reduces the PBG cavity's 402 Q by increasing the effective refractive index of the PBG cavity 402, as seen by the resonant mode. Similarly, decreasing the defect length 499 produces the opposite results. Thus, the resonant wavelength of the PBG structure may be shifted by changing the defect length 499. Similarly, the resonant wavelength may be altered by changing the size defect or the refractive index of the material comprising the refractive index defect.

In FIG. 4, a spacing defect is shown in a rectangular PBG array 402, whereby the spacing 498 between all features is the same in both the x and y direction, except for the spacing 499 in the x direction between the fourth and fifth column of features. Between these two columns, a periodicity defect in the otherwise periodically spaced features 410 . . . 497 is positioned within the waveguide 403 to create an allowed photonic state within the band gap.

Figure 1B:
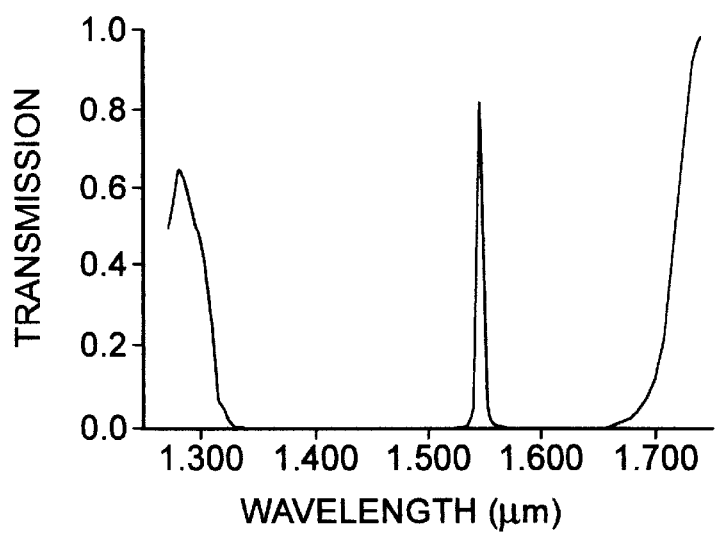
FIG. 1(b) illustrates the spectral response of the PBG in FIG. 1(a) over a band gap demonstrating a narrow resonant transmission state.

However, an appropriately designed TLIR 400 formed as a micro-laser may operate as a micro-laser even if the PBG 402 has no defect leading to a corresponding resonant PBG transmission peak within the band gap. For example, if the resonant wavelength for the first and second SWS gratings 407/408 coincides with an allowed state located at the PBG band edge, such as approximately 1300 nm or 1700 nm, as shown in FIG. 1(b), a micro-laser formed from TLIR 400 may lase at a wavelength approximately equal to the selected band edge wavelength.

PBG structures 402 exhibit primarily longitudinal resonances, sustaining propagating modes along the length of the cavity in a direction parallel to the incident wave 418. Single mode PBG 402 resonances are generally realized by using a waveguide thickness of approximately 0.5 to 1.0 wavelength and by placing uniform size and shape low index of refraction PBG features 410 . . . 497, preferably extending at least completely through the thickness of the waveguide material 403.

In instances when a cladding layer 404 is used, depending on the relative refractive indexes of the waveguide 403, the cladding layer 404 and the material filling PBG features 410 . . . 497, it may be desirable to extend the PBG features 410 . . . 497 into the cladding layer 404 as shown in FIG. 4 to avoid localized refractive index inversion regions. A localized refractive index inversion region is a region where the localized refractive index of the cladding layer 404 exceeds the effective refractive index of the waveguide 403. If this inversion condition results, the operation of the TLIR 400 may be degraded due to significant electromagnetic energy escaping the waveguide 403 in favor of the higher relative refractive index cladding layer 404. If the nominal waveguide 403 refractive index is only slightly greater than that of the cladding layer 404, introduction of PBG features 410 . . . 497 can result in the cladding layer 404 having a higher refractive index compared to the waveguide 403 in waveguide regions that surround PBG features 410 . . . 497. Etching PBG features 410 . . . 497 into the cladding layer 404 can reduce the effective refractive index of the cladding layer 404 in the vicinity of PBG features 410 . . . 497 to help avoid a refractive index inversion.

As shown by FIGS. 3(b) and 3(c), separating two broadband SWS mirrors such as 407 and 408 an optical path length equal to a number of half wavelengths results in a device that transmits nearly 100% over a very narrow range of wavelengths determined by the optical path length between the SWS mirrors 407/408. Based on superposition of separate simulations of (i) SWS mirrors 407/408 and (ii) PBG 402, TLIR 400 has essentially the same transmission resonance characteristics as the SWS mirrors shown in FIGS. 3(b) and 3(c).

If SWS gratings 407 and 408 operated as narrowband mirrors as described by Grann, it would be difficult to successfully fabricate a functional micro-laser from TLIR 400, because TLIR 400 would likely not produce desired resonant narrowband transmitter characteristics. By designing individual SWS structures 407 and 408 to function as broadband reflectors, the optical resonator formed by SWS mirrors 407/408 is simply determined by the optical distance between the two SWS gratings 407 and 408. Thus, SWS gratings 407/408 exhibit a narrow transmission peak at a wavelength determined almost exclusively by the spacing between the SWS gratings 407/408 and the effective refractive index of the waveguide material 420. Transmission resonances for SWS gratings 407/408 are primarily transverse to the propagation direction of the photon beam, coupling the incident wave into the plane of the grating material.

The spacing between SWS gratings 407/408 and the features positioned in the outermost PBG 402 columns, such as 440 and 447, should be controlled to avoid undesirable effects. Ideally, the spacing between SWS gratings, such as 408 and outermost features, such as feature 440, should be substantially the same as the nominal feature spacing between PBG features 498. By setting this distance 419 equal to the PBG feature spacing 498, the waveguide material 403 in this region is maintained at substantially the same effective refractive index as near PBG features not positioned in an outermost column, such as 421. A different distance 419 can result in a different effective refractive index in this region and cause undesirable effects such as Fresnel reflections.

Figure 5:
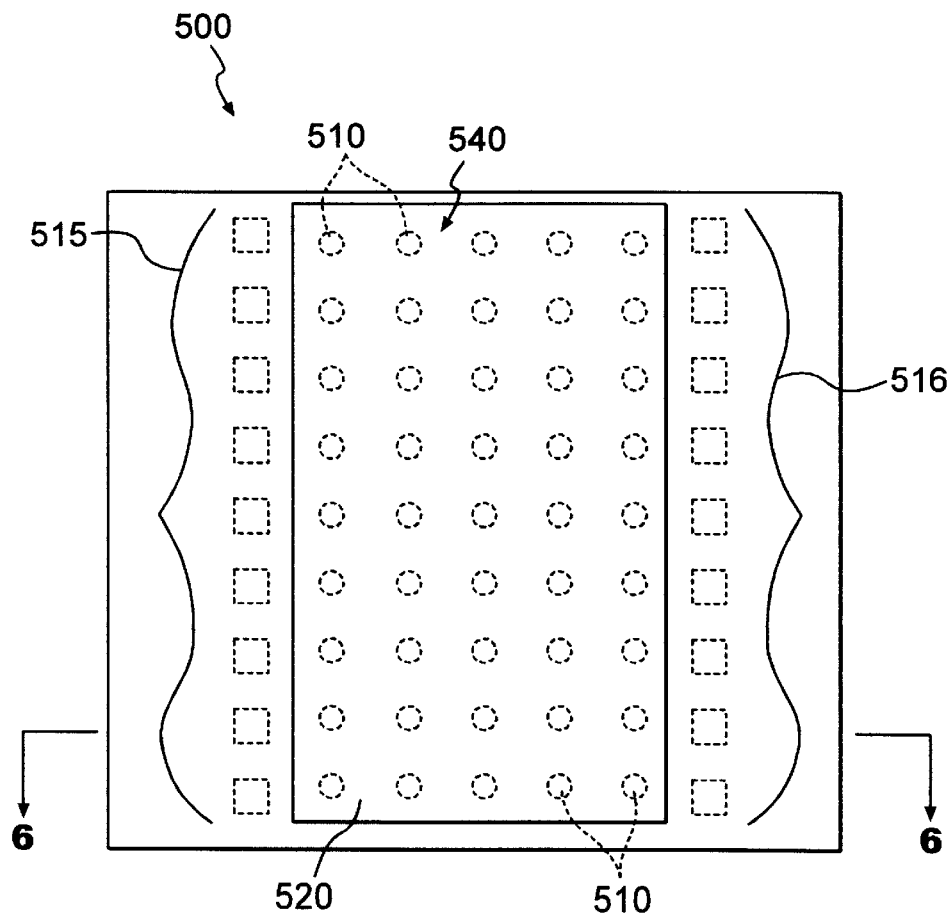
FIG. 5 illustrates a perspective view of a micro-laser, representing an embodiment of the present invention.

Referring to FIG. 5 in conjunction with FIG. 4, a micro-laser 500 may be formed starting with the basic TLIR 400 structure comprising PBG 540 and SWS gratings 515/516. PBG 540 can provide the ability to introduce external substances (gases, liquids or solids) via PBG features 510 into the highly resonant guided wave microcavity provided by TLIR 400. Although PBG features 510 are shown as holes, appropriately placed periodic features (not shown) may be used as an alternative to holes. For example, solid amplifying mediums may be formed in appropriately placed periodic features within the waveguide, for example, by ion implantation into the waveguide, or related methods.

The high Q available from TLIR 400 permits smaller volumes to generate comparable laser power to the power output by comparatively larger laser cavities. Moreover, in gas micro-laser 500 applications, the small size of PBG features 510 permits the use of a higher gas pressure which results in a higher laser output power due to enhanced conductive gas cooling through an enhanced collision rate by the amplifying gas with the walls of PBG features 510. Optional layer 520 as shown in FIG. 5 is a discharge electrode layer, which together with an optional lower discharge electrode layer (not shown in FIG. 5; see 622 in FIG. 6), permits electrical pumping of micro-laser 500.

Spontaneous emission is the dominant "loss" mechanism in conventional laser devices. When micro-laser 500 places an amplifying medium having one or more thermodynamically favorable electronic transition frequencies in PBG 540 having a band gap which includes the one or more favorable electronic transition frequencies, spontaneous emission may be inhibited. Thus, micro-laser 500 may lase at a near zero pumping threshold permitting operation in a nearly lossless manner. A low threshold also permits fast turn on times, but may result in longer turn off times in modulation applications.

Micro-laser 500 comprises a highly guided, high Q microcavity due to the combined waveguiding effects produced by combining PBG 540 and the resonator formed by SWS mirrors 515/516. The highly guided microcavity formed by the combination of PBG 540 and the resonator formed by SWS mirrors 515/516 reduces the signal noise of light output by micro-laser 500, even beyond the noise reduction levels possible through use of PBG 540 alone. Through near elimination of spontaneous emission and restriction on permitted propagation modes of photons in the micro-laser 500 cavity, ultra low noise light may be produced by micro-laser 500.

Moreover, the low noise light source produced by micro-laser 500 may be modulated at high speed by virtue of micro-laser's 500 low pumping threshold. This modulatible and highly coherent low noise light source may be output to another optical waveguide for a variety of applications including data transfer and optical computing. Providing the output of micro-laser 500 for long distance low bit error rate optical data communication applications is a possible application of this invention.

In the preferred embodiment of micro-laser 500, micro-laser 500 is configured as a gas laser to minimize quantum noise. Generation of an ultra low noise light output enables applications such as optical telecommunications, optical data transfer, optical signal regeneration and optical computing to proceed without the need for electronic conversion by encoding optical bits of information in a photon distribution pattern. Low noise light advantageously leads to transmission of optical signals over long distances, such as over fiber optic lines, with correspondingly low bit error rates.

Figure 6:
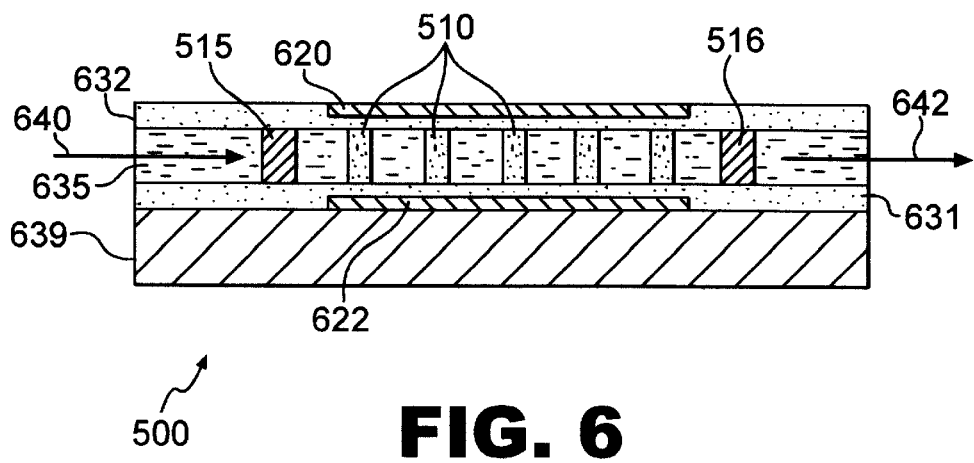
FIG. 6 illustrates a side cross section of the micro-laser shown in FIG. 5, taken along line 6—6 in FIG. 5.

Referring to FIG. 6, a cross section of the micro-laser shown in FIG. 5 is shown. Micro-laser 500 operates by amplifying input light 640 and producing a highly coherent, low noise amplified light output 642. Light output 642 may be continuous or pulsed, depending on the pumping supplied to the amplifying medium substantially filling PBG features 510. Although lower buffer layer 631, upper buffer layer 632 and discharge electrode layers 620 and 622 are shown in FIG. 6, layers 631, 632, 620 and 622 are not necessarily required for operation of micro-laser 500. For example, assuming micro-laser 500 includes an appropriate supporting layer 639 having a refractive index lower than that of waveguide 635, a lower buffer layer 631 is not required as the supporting layer 639 will act as a suitable cladding layer relative to the waveguide material 635. If supporting layer 639 has a refractive index nearly equal or greater than waveguide material 635, a lower refractive index lower buffer layer 631 is preferably included to function as a cladding layer and to extend under SWS gratings 407/408. Upper buffer layer 632 will not be required in gas micro-laser 500 applications where the ambient surrounding the micro-laser 500 supplies the required amplifying medium to substantially fill PBG feature 510.

If upper buffer 632 and/or lower buffer layers 631 are used, the buffer layers should have a lower index of refraction compared to that of the effective refractive index of the waveguide 635 material together with PBG features 510. Although the same materials can be used for the upper buffer 632 and lower buffer layer 631, the invention is not so restricted. Upper buffer layer 632 may be used to cover the PBG features 510 and seal the amplifying medium within the PBG features 510. Use of an appropriate lower buffer layer 631 having an appropriate minimum thickness to hide a given supporting layer 639 from light within the waveguide 635, permits the use of a high refractive index supporting layer 639 material selected based on process requirements, without regard to optical considerations such as refractive index. Thus, if micro-laser 500 includes an appropriate lower buffer layer 631, micro-laser 500 may be formed on supporting layers 639, such as common bulk substrate materials such as silicon, germanium or galium arsenide.

In most micro-laser 500 applications, pumping is required. Electrical pumping may be used for this purpose. Electrically pumped micro-laser 500 preferably includes upper and lower conductive discharge electrodes, best seen in FIG. 6 as layers 620 and 622. Discharge electrodes such as 620 and 622 may cover the entire resonator waveguide area as shown in FIG. 6, or cover only PBG features (not shown). If discharge electrodes 620 and 622 are used, lower and upper buffer layers 632 and 631 should be formed having sufficient thickness to "hide" the lossy discharge electrodes 620 and 622 from the light waves propagating back and forth in the micro-laser 500 waveguide. Conductive electrodes such as metal coatings in direct contact or in proximity to the waveguide material 635 will cause strong attenuation. A RF oscillation source may be fabricated simultaneously with the micro-laser, the micro-laser and RF oscillator sharing the same die on a given bulk substrate material, such as a silicon wafer.

Preferably, the buffer layers 631 and 632 should be at least the thickness of the micro-laser 500 lasing wavelength. Each buffer layer may comprise a number of separate layers. Multiple buffer layers may be used to gradually transition from a given bulk substrate material to permit the formation of a desired waveguide material having enhanced crystalline quality, for example. In the preferred embodiment of an electrically pumped $CO_2$ micro-laser 500, a RF discharge will be applied between the discharge electrodes 620 and 622 to limit the dissociation rate of the $CO_2$ molecules compared to DC pumping. RF pumping allows a pulsed micro-laser 500 output and may also provide a continuous output.

Discharge electrodes 620 and 622 also permit application of a DC bias. In this case, a continuous wave (CW) output can be produced by micro-laser 500.

Micro-laser 500 may also be pumped by optical pumps. Optical pumping can be employed using laser diodes, a UV laser or an external high intensity lamp. Alternatively, a possible optical pumping source is a solid state waveguide constructed using a YAG or similar lasing crystal itself pumped with laser diodes, UV lamp or high intensity external lamp.

Micro-laser 500 will preferably be generally be transversely pumped by application of an electric field between upper and lower discharge electrodes 620 and 622, thus orienting the resulting electrical field perpendicular to the length of the micro-laser 500 cavity. Use of a thin waveguide 635 (0.5 to 1 optical wavelength) results in a short separation distance between discharge electrodes. Accordingly, low applied voltages, such as only approximately 5 to 10 v is required to initiate lasing. A lower voltage is generally necessary to sustain lasing once lasing is initiated.

Suitable buffer materials are materials having a refractive index less than the effective refractive index of waveguide material 635. For example, for a $CO_2$ laser operating near $10\mu$, preferred buffer materials include zinc selenide and barium fluoride. Preferred waveguide materials for a $CO_2$ laser include germanium, silicon and cadmium telluride. As noted in the TLIR 400 discussion, introduction of an amplifying medium into the PBG features may shift the resonant frequencies of both the resonator formed from SWS mirrors 515/516 and PBG 510. Accordingly, tuning may be necessary to result in substantially equal respective resonator frequencies to permit proper operation of micro-laser 500.

Even though electro-optic modulation is normally not used in a typical laser, it may still be desirable to retain the ability to change the micro-laser 500 cavity's optical path length. For the micro-laser 500 cavity to properly operate as a laser, PBG 540 should be substantially transmissive at a wavelength preferably substantially equal to the resonant wavelength of the resonator formed by SWS gratings 515/516. If the respective transmissive wavelengths following fabrication do not coincide sufficiently for proper micro-laser 500 operation, one or more methods for tuning micro-laser 500 may be used.

As used herein, tuning refers to the process of reducing the difference between the PBG 540 resonant wavelength and the resonant wavelength of the resonator formed by SWS gratings 515/516. Tuning may be used to result in the respective resonant wavelengths being substantially equal. Preferably, the ratio of the nominal transmission resonance ($\lambda$) divided by the spread in resonant wavelengths ($\Delta\lambda$) should be less than the square root of the product of the Qs of the individual resonators. The nominal transmission resonance wavelength ($\lambda$) may be defined as the arithmetic mean of the PBG 540 resonant wavelength and the resonant wavelength of the resonator formed by SWS gratings 515/516. For example, if the PBG 540 has a Q of 1,000 and the resonator formed by the SWS gratings 515/516 has a Q of 10,000, and $\lambda=1\mu$, the calculated preferred maximum wavelength spread ($\Delta\lambda$) is found to be approximately 3.16 Å. Most preferably, the ratio of the nominal transmission resonance wavelength ($\lambda$) divided by the spread in resonant wavelengths ($\Delta\lambda$) should be less than ½ the square root of the product of the Qs of the individual resonators.

For example, micro-laser 500 may be tuned by modification of the optical path length of micro-laser 500. Optical path length modification primarily shifts the resonant wavelength of the resonator formed by SWS gratings 515/516.

One group of tuning techniques involves adjusting the micro-laser 500 cavity's refractive index. For example, an electrical field may applied if the cavity material exhibits an electro-optic, Pockels or Kerr effect. Some materials exhibit a photo-refractive effect whereby shining a light onto a cavity filled with a photo-refractive material changes the material's refractive index. Other materials are thermal-cavity materials, which change refractive index due to thermal expansion. Some cavity materials are magneto-optic and will change refractive index based on applied magnetic field strength. Almost all materials show, at least to some degree, electro-optical, photo-refractive, magneto-optical, and thermal effects. Depending on the micro-laser 500 cavity's Q and waveguide material, any one or a combination of these tuning methods can be used.

A cavity's optical path length may also be changed without changing the cavity's refractive index. For example, the cavity may be theoretically tilted with respect to the incident optical wave. As the tilt angle measured from the normal increases, the effective cavity length increases. As the effective cavity length increases, the resonant wavelength of the resonator formed by SWS gratings 515/516 also increases. Laser trimming is also possible to tune micro-laser 500, but is not preferred due to the coverage area required.

An electro-optic waveguide 635 may be used to permit fine tuning the resonant wavelength of the resonator formed by SWS gratings 515/516. Typically, electro-optic waveguides for micro-laser 500 are preferred only when non electrical pumping is used, because electrical pumping will also produce an electro-optic effect on the micro-laser 500 cavity if an electro optic waveguide material is used. Even if discharge electrodes are substantially contained within PBG features 510, significant electric field intensity could extend into the electro optic waveguide material and influence the cavity's resonance.

However, if a dye laser is built, for example, pumping may be optical from another laser or from a laser diode. In this example and for other micro-lasers 500 which are non-electrically pumped, use of an electro-optic waveguide material and the electro-optic effect may enable convenient tuning for micro-laser 500.

The transmission resonance of PBG 540 may also be adjusted. For instance, this resonance may be changed via changing the gas or liquid density within the PBG features 510 when such fluids are used as amplifying mediums. Alternatively, in the case of holes, the hole size may also be adjusted, possibly through laser trimming.

Micro-laser 500 may further comprise a gas reservoir. A gas reservoir is highly desirable for gases prone to dissociation, such as $CO_2$. A reservoir may be formed by etching out the cladding layer under PBG features 510. Capping layers will generally be provided after the gas reservoir is filled to seal in the gas. Reservoirs may be used in conjunction with electrical pumping. For example, in electrical pumping applications, reservoir access to PBG features 510 can be made through openings that extend through the buffer layers and discharge electrodes. The openings may provide access to reservoir gas while occupying a reasonably small percentage of the PBG feature 510 area, permitting discharge electrodes to occupy most of the PBG feature 510 area.

For pulsed laser applications, micro-laser 500 may also be switched with a Q-switch. A very large Q-switch pulse occurs when the cavity's Q is first kept very low, using techniques such as rotating mirrors or saturable absorbers, so that the population inversion achieved is greater than the inversion level normally attainable. A high intensity, short pulse of coherent radiation is emitted when the Q is raised to its normal value. The Q-switch may be fabricated on the same bulk substrate material die as micro-laser 500.

Operation of the micro-laser 500 may generate sufficient heat which can shift the cavity's resonant frequency mainly by altering feature dimensions. However, the small size of the micro-laser 500 generally allows sufficient cooling through thermal conduction through the micro-laser 500. If the micro-laser 500 is formed on a bulk substrate, such as a semiconductor substrate, the bulk substrate may be placed on a heat sink to provide additional cooling to micro-laser 500.

Alternatively, in order to maintain dimensional stability in situations where micro cavity 500 encounters power levels which may create dimensional anomalies, classical methods of thermoelectric cooling can be utilized. For example, a Peltier cell can be thermally connected to the substrate to lend temperature control to micro cavity 500. Whenever the grating temperature exceeds a certain amount, Peltier cell functions to cool the micro cavity 500 via conventional thermoelectric means.

The invention permits a high packing density. The resonant structure is thin, the waveguide thickness being about ½ to 1 resonant wavelength thick for single mode micro-laser 500 operation. Being a sub-wavelength structure, micro-laser 500 may be only several wavelengths wide and several wavelengths long, thus permitting a high packing density. For example, for a lasing wavelength of $1.5\mu$, the required area for micro-laser 500 is approximately 15 to 20 square microns. It is conceivable multiple micro-laser 500 structures can also be fabricated on top of one another, further increasing density. High packing densities allow multiple micro-lasers 500 to be produced on the same die with multiple die on a given substrate.

Each micro-laser 500 can be designed or tuned to a particular wavelength, enabling the processing of multi-wavelength input signals. The invention also permits simultaneous fabrication of electronic or other optical components on the same die, such as an electronic oscillator for use as a convenient pumping source.

Micro-laser 500 may be fabricated by appropriate selection of parameters to produce lasing wavelengths as small as several hundred angstroms, using features producible by state of the art electron beam lithography. Expected future advances in lithography will enable micro-laser 500 to lase at wavelengths even smaller than several hundred angstroms. Fabrication of micro-laser 500 to lase at longer wavelengths is necessarily easier, as the required feature size to produce sub wavelength effects expands accordingly. Thus, formation of a $CO_2$ micro-laser 500 to lase at nearly $10.6\mu$ is easily produced by the invention. Micro-lasers 500 lasing at wavelengths longer than $10.6\mu$ may be formed using the invention.

The particular manufacturing process used for fabricating the micro-laser 500 should preferably be inexpensive and reproducible. Conveniently, both the PBG 540, SWS gratings 515 and 516, and optional buffer layers and discharge electrodes of the present invention can be carried out by using any standard integrated optics manufacturing or electronic integrated circuit manufacturing method.

Individual components need not be formed in the disclosed shapes, or assembled in the disclosed configuration, but could be provided in virtually any shape and assembled in virtually any configuration. Further, the individual components need not be fabricated from the disclosed materials, but could be fabricated from virtually any suitable materials. Further, although the micro-laser 500 structure described herein is a physically separate module, it will be manifest that micro-laser 500 may be easily integrated into integrated circuits. Furthermore, all the disclosed elements and features of each disclosed embodiment can be combined with, or substituted for, the disclosed elements and features of every other disclosed embodiment except where such elements or features are mutually exclusive.

What is claimed is:

1. A micro-laser, comprising an integrated optical resonator adapted for lasing, comprising:
    a waveguide;
    a first and a second subwavelength resonant grating in said waveguide; and
    a photonic band gap resonant structure (PBG) in said waveguide, said PBG positioned between said first and second subwavelength resonant gratings, and
    at least one amplifying medium in said waveguide.

2. A micro-laser, comprising an integrated optical resonator adapted for lasing, comprising:
    a waveguide;
    a first and a second subwavelength resonant grating in said waveguide; and
    a photonic band gap resonant structure (PBG) having a plurality of holes in said waveguide, said PBG positioned between said first and second subwavelength resonant gratings, and
    at least one amplifying medium substantially filling said PBG holes.

3. The micro-laser of claim 2, wherein said waveguide is at least one selected from the group consisting of Si, Ge, ZnSe, $BaF_2$, CdTe, $LiNbO_3$ and SBN.

4. The micro-laser of claim 2, wherein said waveguide is formed from at least one electro-optic material.

5. The micro-laser of claim 4, wherein said electro-optic material is at least one selected from the group consisting of CdTe, $LiNbO_3$ and SBN.

6. The micro-laser of claim 2, wherein said waveguide is a substantially planar waveguide, and further comprising at least one cladding layer positioned adjacent to said planar waveguide.

7. The micro-laser of claim 6, wherein said at least one cladding layer comprises at least one lower buffer layer positioned under said waveguide and at least one upper buffer layer positioned over said waveguide.

8. The micro-laser of claim 6, further comprising a bulk substrate material, wherein said at least one cladding layers are positioned on said bulk substrate material.

9. The micro-laser of claim 8, wherein said bulk substrate material is at least one selected from the group of silicon, gallium arsenide and indium phosphate.

10. The micro-laser of claim 2, wherein said first and second subwavelength resonant gratings and said PBG holes are embedded in said waveguide.

11. The micro-laser of claim 7, wherein said cladding layers are at least one selected from the group consisting of glasses, $BaF_2$ and zinc selenide.

12. The micro-laser of claim 2, wherein said PBG comprises at least one row of PBG holes having at least one defect therein.

13. The micro-laser of claim 12, wherein said defect is at least one selected from the group consisting of a spacing defect and a size defect.

14. The micro-laser of claim 6, wherein said PBG holes extend into said cladding layer.

15. The micro-laser of claim 2, wherein said amplifying medium comprises at least one gas.

16. The micro-laser of claim 15, wherein said at least one gas includes carbon-dioxide.

17. The micro-laser of claim 15, further comprising a reservoir for said at least one gas adjacent to said micro-laser.

18. The micro-laser of claim 2, wherein said amplifying medium comprises at least one liquid.

19. The micro-laser of claim 18, wherein said liquid includes at least one dye.

20. The micro-laser of claim 2, wherein said amplifying medium comprises at least one lasing crystal.

21. The micro-laser of claim 20, wherein said lasing crystal is at least one selected group of ruby laser, holmium YAG and erbium YAG.

22. The micro-laser of claim 2, further comprising at least one pump for energizing said amplifying medium.

23. The micro-laser of claim 22, wherein said at least one pump includes an optical pump.

24. The micro-laser of claim 22, wherein said at least one pump includes an electrical pump.

25. The micro-laser of claim 23, wherein said electrical pump is an RF oscillator.

26. The micro-laser of claim 25, further comprising at least one cladding layer and a bulk substrate material, wherein said at least one cladding layer is positioned on said bulk substrate material and said RF oscillator is formed on said bulk substrate material.

27. The micro-laser of claim 22, wherein said at least one pump includes a laser diode.

28. The micro-laser of claim 27, further comprising a bulk substrate material, wherein said laser diode is formed on said bulk substrate material.

29. The micro-laser of claim 22, wherein said at least one pump includes a laser pump.

30. The micro-laser of claim 29, wherein said laser pump is a UV laser.

31. The micro-laser of claim 7, further comprising a pair of electrically conductive discharge electrodes, wherein said electrically conductive discharge electrodes substantially cover said PBG holes and are separated from said waveguide by said buffer layers.

32. The micro-laser of claim 31, further comprising a bulk substrate material and an RF oscillator, wherein said RF oscillator is formed on said bulk substrate material and is electrically connected to said electrically conductive discharge electrodes.

33. The micro-laser of claim 12, where in said rows of PBG holes are arranged in linear arrays.

34. The micro-laser of claim 2, wherein each said subwavelength resonant grating structure comprises a substantially periodic array of SWS features.

35. The micro-laser of claim 34, wherein said SWS features from said first and second resonant grating are arranged in substantially linear arrays.

36. The micro-laser of claim 35, wherein said SWS features from said first and second resonant grating are arranged along arcs having a radius of curvature.

37. The micro-laser of claim 2, wherein said PBG holes are arranged along arcs having a radius of curvature.

38. The micro-laser of claim 35, wherein said SWS features are formed from a material having a refractive index higher than that of a material comprising said waveguide.

39. The micro-laser of claim 38, wherein said SWS features are formed from at least one selected from the group consisting of Ge, $BaF_2$, $LiNbO_3$, SBN and Si.

40. The micro-laser of claim 8, further comprising a heat sink positioned in contact with said bulk substrate material.

41. The micro-laser of claim 2, wherein said micro-laser sustains substantially only one propagating mode.

42. The micro-laser of claim 2, wherein said micro-laser sustains substantially at least two propagating modes.

43. The micro-laser of claim 11, wherein a resonator formed by said first and a second subwavelength resonant grating have a first transmission resonance and said PBG has a second transmission resonance, wherein said transmission resonances are substantially equal.

44. The micro-laser of claim 8, wherein a plurality of said micro-lasers are formed on said bulk substrate material.

45. The micro-laser of claim 44, wherein said bulk substrate material comprises a plurality of die, wherein said plurality of micro-lasers are positioned on each said die.

46. The micro-laser of claim 45, wherein said plurality of lasers lase at a plurality of wavelengths.

47. A method for tuning a micro-laser, comprising the steps of:
providing a first and second subwavelength resonant grating structure in a waveguide, said first and second subwavelength resonant grating structure having a first resonant transmission wavelength;
providing a photonic band gap resonant structure (PBG) in said waveguide, said PBG positioned between said first and second subwavelength resonant grating structures, said PBG having a second resonant transmission wavelength; and
tuning at least one of said transmission resonances to result in said transmission resonance wavelengths being substantially equal.

48. The method for tuning the micro-laser of claim 47, further comprising the step of introducing at least one amplifying medium into said PBG before said tuning.

49. The method for tuning the micro-laser of claim 47, wherein following said tuning, wherein following said tuning, a nominal transmission resonance wavelength ($\lambda$) divided by a difference between said PBG transmission resonance wavelength and said transmission resonance wavelength of said first and second subwavelength resonant gratings is less than a square root of the product of a Q of said PBG Q and a Q of said first and second subwavelength resonant gratings.

50. The method for tuning the micro-laser of claim 49, wherein following said tuning, a nominal transmission resonance wavelength ($\lambda$) divided by a difference between said PBG transmission resonance wavelength and said transmission resonance wavelength of said first and second subwavelength resonant gratings is less than one half a square root of the product of a Q of said PBG Q and a Q of said first and second subwavelength resonant gratings.

51. The method for tuning the micro-laser of claim 47, wherein said tuning is at least one selected from the group of electro-optic, photo-refractive, thermal, magneto-optic and tilting.

52. A method for producing a micro-laser, comprising the steps of:
forming at least one cladding layer;
forming a waveguide over said cladding layer;
providing a first and second subwavelength resonant grating structure in said waveguide, and
providing a photonic band gap resonant structure (PBG) in said waveguide, wherein said PBG is positioned between said first and second subwavelength resonant grating structure, said waveguide having at least one amplifying medium therein.

53. A method for producing a micro-laser in claim 52, wherein said PBG comprises a plurality of holes, further comprising the step of filling said PBG holes with at least one amplifying medium.

54. A method for producing a micro-laser in claim 52, further comprising the step of providing a bulk substrate material, said at least one cladding layer formed over said bulk substrate.

55. The method for producing a micro-laser in claim 53, wherein said cladding layer comprises at least one lower buffer layer under said PBG holes and at least one upper buffer layer over said PBG holes.

56. The method for producing a micro-laser of claim 55, further comprising the steps of forming a first electrically conductive film over said at least one lower buffer layer and forming a second electrically conductive film over said upper buffer layer, said electrically conductive films each forming electrically conductive discharge electrodes, wherein said PBG holes are substantially covered by each of said electrically conductive discharge electrodes.

57. The method for producing a micro-laser of claim 56, further comprising the step of forming an RF oscillator on said bulk substrate material, said RF oscillator electrically connected to said electrically conductive discharge electrodes.

58. A method for producing at least two micro-lasers on a bulk substrate material, said micro-lasers each operable at a lasing wavelength, comprising the steps of:
providing said bulk substrate material;
forming at least one cladding layer over said bulk substrate material;

forming a waveguide over said at least one cladding layer;

providing a first and second subwavelength resonant grating structure in said waveguide, and providing a photonic band gap resonant structure (PBG) in said waveguide, wherein said PBG is positioned between said first and second subwavelength resonant grating structure, said waveguide having at least one amplifying medium therein.

59. A method for producing at least two micro-lasers of claim 58, wherein said PBG comprises a plurality of holes, further comprising the step of substantially filling said PBG holes with said amplifying medium.

60. A method for producing at least two micro-lasers or claim 58, wherein said lasers formed operate at a plurality of different wavelengths.

61. A method for producing at least two micro-lasers or claim 58, wherein said amplifying medium is at least one gas, further comprising the step of forming a reservoir for said at least one gas adjacent to said micro-lasers.

62. The method for producing at least two micro-lasers or claim 59, wherein said at least one cladding layer comprises at least one lower buffer layer under said PBG holes, further comprising the step of forming at least one upper buffer layer over said PBG holes.

63. The method for producing at least two micro-lasers or claim 62, further comprising the steps of forming a first electrically conductive film over said at least one lower buffer layer and forming a second electrically conductive film over said upper buffer layer, said electrically conductive films each forming electrically conductive discharge electrodes, wherein said PBG holes are substantially covered by each of said electrically conductive discharge electrodes.

64. The method for producing at least two micro-lasers or claim 63, further comprising the step of forming an RF oscillator on said bulk substrate material, said RF oscillator electrically connected to said electrically conductive discharge electrodes.

65. A method for processing an electromagnetic signal, comprising the steps of:

providing a micro-laser including a waveguide, a first and a second subwavelength resonant grating in said waveguide, and a photonic band gap resonant structure (PBG) in said waveguide, said PBG positioned between said first and second subwavelength resonant gratings, and at least one amplifying medium in said waveguide, and utilizing said micro-laser for laser radar.

66. A method for processing an electromagnetic signal comprising the steps of:

providing a micro-laser including a waveguide, a first and a second subwavelength resonant grating in said waveguide, and a photonic band gap resonant structure (PBG) in said waveguide, said PBG positioned between said first and second subwavelength resonant gratings, and at least one amplifying medium in said waveguide, and utilizing said micro-laser for optical signal regeneration.

67. A method for using low noise coherent light, comprising the steps of:

providing a micro-laser including a waveguide, a first and a second subwavelength resonant grating in said waveguide, and a photonic band gap resonant structure (PBG) in said waveguide, said PBG positioned between said first and second subwavelength resonant gratings, and at least one amplifying medium in said waveguide, and directing an output of said micro-laser into another optical waveguide.

68. A method for using a low noise coherent light beam of claim 67, wherein said another optical waveguide is a fiber optic waveguide.

69. A method for using a low noise coherent light beam of claim 68, further comprising the step of modulating said micro-laser.

70. A method for using a low noise coherent light beam of claim 69, wherein said modulated micro-laser output is used for data transfer.

71. A method for using a low noise coherent light beam of claim 70, wherein said data transfer is used in a communication system.

72. A method for using a low noise coherent light beam of claim 70, wherein said modulated micro-laser output is used for optical computing.

73. A method for processing an electromagnetic signal, comprising the steps of:

providing a micro-laser including a waveguide, a first and a second subwavelength resonant grating in said waveguide, and a photonic band gap resonant structure (PBG) having a plurality of holes in said waveguide, said PBG positioned between said first and second subwavelength resonant gratings, and at least one amplifying medium comprising at least one gas substantially filling said PBG holes, and utilizing said micro-laser for laser radar.

74. A method for processing an electromagnetic signal, comprising the steps of:

providing a micro-laser including a waveguide, a first and a second subwavelength resonant grating in said waveguide, and a photonic band gap resonant structure (PBG) having a plurality of holes in said waveguide, said PBG positioned between said first and second subwavelength resonant gratings, and at least one amplifying medium comprising at least one gas substantially filing said PBG holes, and utilizing said micro-laser for optical signal regeneration.

75. A method for using low noise coherent light, comprising the steps of:

providing a micro-laser including a waveguide, a first and a second subwavelength resonant grating in said waveguide, and a photonic band gap resonant structure (PBG) having a plurality of holes in said waveguide, said PBG positioned between said first and second subwavelength resonant gratings, and at least one amplifying medium comprising at least one gas substantially filing said PBG holes, and directing an output of said micro-laser into another optical waveguide.

76. A method for using a low noise coherent light beam of claim 75, wherein said another waveguide is a fiber optic waveguide.

77. A method for using a low noise coherent light beam of claim 76, further comprising the step of modulating said micro-laser.

78. A method for using a low noise coherent light beam of claim 77, wherein said modulated micro-laser output is used for data transfer.

79. A method for using a low noise coherent light beam of claim 78, wherein said data transfer is used in a communication system.

80. A method for using a low noise coherent light beam of claim 78, wherein said modulated micro-laser output is used for optical computing.

* * * * *